(12) United States Patent
Liikanen et al.

(10) Patent No.: US 11,189,352 B2
(45) Date of Patent: Nov. 30, 2021

(54) ADJUSTMENT OF PROGRAM VERIFY TARGETS CORRESPONDING TO A LAST PROGRAMMING DISTRIBUTION AND A PROGRAMMING DISTRIBUTION ADJACENT TO AN INITIAL PROGRAMMING DISTRIBUTION

(71) Applicant: Micron Technology, Inc., Boise, ID (US)

(72) Inventors: Bruce A. Liikanen, Berthoud, CO (US); Larry J. Koudele, Erie, CO (US); Michael Sheperek, Longmont, CO (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/295,845

(22) Filed: Mar. 7, 2019

(65) Prior Publication Data

US 2020/0286567 A1 Sep. 10, 2020

(51) Int. Cl.
*G11C 16/34* (2006.01)
*G11C 11/56* (2006.01)
*G11C 5/04* (2006.01)

(52) U.S. Cl.
CPC ............ *G11C 16/3404* (2013.01); *G11C 5/04* (2013.01); *G11C 11/5628* (2013.01); *G11C 11/5642* (2013.01); *G11C 16/3459* (2013.01); *G11C 2211/5623* (2013.01); *G11C 2211/5624* (2013.01); *G11C 2211/5625* (2013.01)

(58) Field of Classification Search
CPC ................ G11C 16/0483; G11C 16/34; G11C 16/3404; G11C 16/3436; G11C 16/3454; G11C 16/3459
USPC .......................... 365/185.17, 185.22, 185.24
See application file for complete search history.

(56) References Cited

U.S. PATENT DOCUMENTS

2013/0094286 A1* 4/2013 Sridharan .......... G11C 16/3418
365/185.2
2014/0204671 A1* 7/2014 Sharon ................... G11C 29/04
365/185.09

\* cited by examiner

*Primary Examiner* — Alfredo Bermudez Lozada
(74) *Attorney, Agent, or Firm* — Lowenstein Sandler LLP

(57) ABSTRACT

A processing device determines difference error counts that are indicative of relative widths of valleys. Each of the valleys is located between a respective pair of programming distributions of a memory cell of the memory component. A program targeting operation is performed on the memory cell to calibrate one or more program verify (PV) targets associated with the programming distributions. To perform the program targeting operation, a rule from a set of rules is selected based on the difference error counts. The set of rules corresponds to an adjusting of a PV target of a programming distribution adjacent to an initial programming distribution. One or more program verify (PV) targets associated with the programming distributions are adjusted based on the selected rule.

20 Claims, 12 Drawing Sheets

ADJUSTMENT OF PROGRAM VERIFY TARGETS CORRESPONDING TO A LAST PROGRAMMING DISTRIBUTION AND A PROGRAMMING DISTRIBUTION ADJACENT TO AN INITIAL PROGRAMMING DISTRIBUTION

TECHNICAL FIELD

Embodiments of the disclosure relate generally to memory sub-systems, and more specifically, relate to calibration of memory cells of the memory sub-systems based on a set of rules corresponding to an adjusting of a program verify (PV) target of a programming distribution adjacent to an initial programming distribution or a PV target of a last programming distribution.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
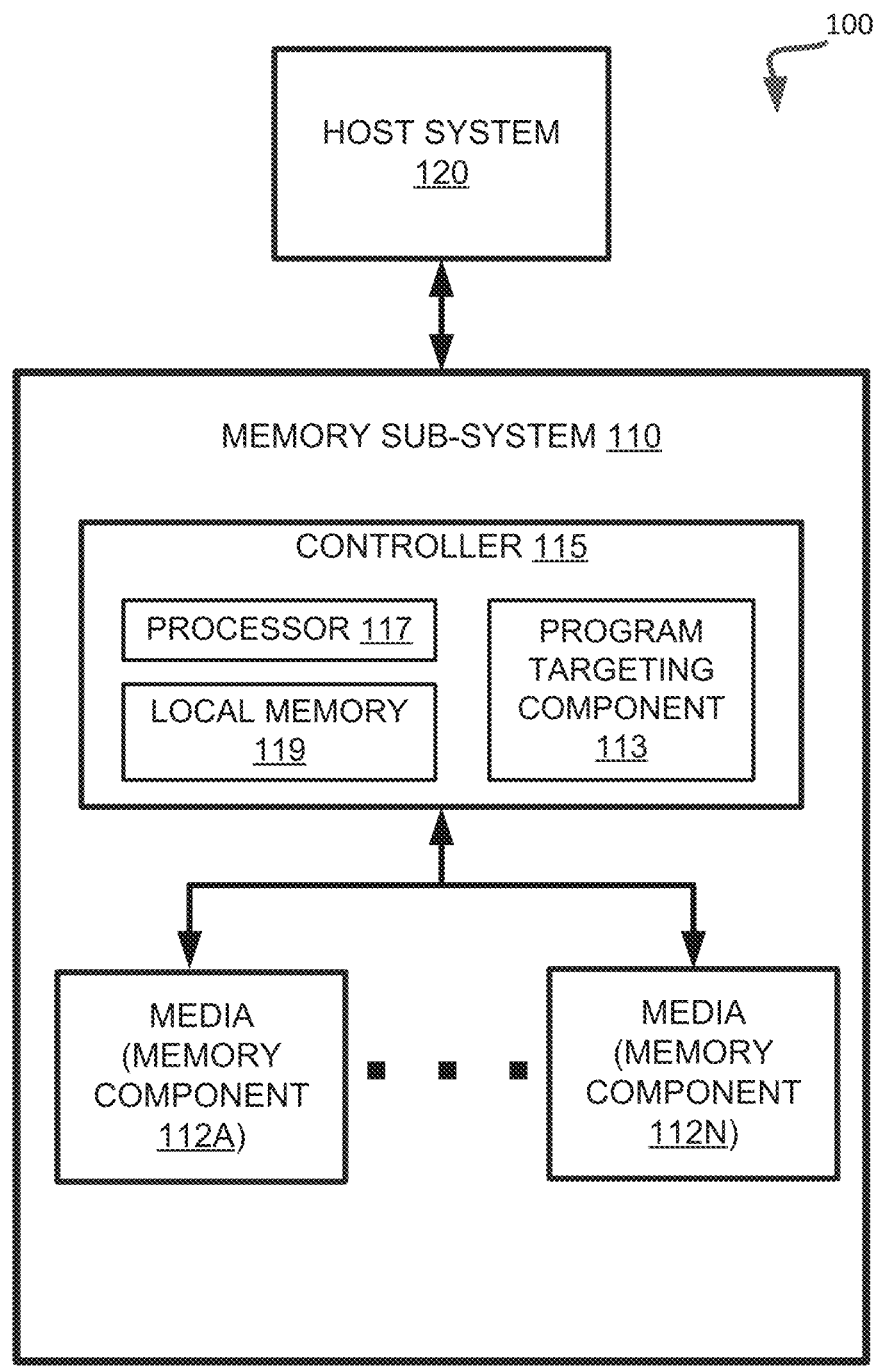
FIG. 1 illustrates an example computing environment that includes a memory sub-system in accordance with some embodiments of the disclosure.

Aspects of the present disclosure are directed to a set of rules to adjust a program verify (PV) target of a programming distribution adjacent to an initial programming distribution or a PV target of a last programming distribution of memory cells of a memory sub-system. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

A single-level cell (SLC) can store only one bit per memory element, whereas a multi-level cell (MLC) is a memory element that is capable of storing more than a single bit of information. It should be noted that the state of the memory cell can be programmed and the state of the memory can be determined by comparing a read voltage of the memory cell against one or more read level thresholds. That is, with SLC NAND flash technology, each cell can exist in one of two states, storing one bit of information per cell, whereas MLC NAND flash memory has four or more possible states per cell, so each MLC-based cell can store two or more bits of information per cell. The higher number of possible states reduces the amount of margin (e.g., valley margin or voltage range) separating the states. The memory device can include triple-level cell (TLC) memory. In TLC memory, the memory cell stores three bits of information per cell with eight total voltage states. The memory device can include a quad-level cell (QLC) memory. In QLC memory, each memory cell can store four bits of information with sixteen voltage states. For example, in a QLC memory, a memory cell can store four bits of data (e.g., 1111, 0000, 1101, etc.) corresponding to data received from the host system using the sixteen voltage states. It can be noted that operations herein can be applied to any multi-bit memory cells.

Each bit of the memory cell is stored at a different portion (also referred to as "logical page" hereafter) of the memory cell. Various read level thresholds can be used for the various logical page types (also referred to as "page types" herein): SLC logical page types are lower logical pages (LPs), MLC logical page types are LPs and upper logical pages (UPs), TLC logical page types are LPs, UPs, and extra logical pages (XPs), and QLC logical page types are LPs, UPs, XPs and top logical pages (TPs). For example, a memory cell of the QLC memory can have a total of four logical pages, including a lower logical page (LP), an upper logical page (UP), an extra logical page (XP) and a top logical page (TP), where each logical page stores a bit of data. For example, a bit can be represented by each of the four logical pages of the memory cell. In a memory cell for QLC memory, each combination of four bits can correspond to a different voltage level (also referred to as "level" hereafter). For example, a first level of the memory cell can correspond to 1111, a second level can correspond to 0111, and so on. Because a memory cell for a QLC memory includes 4 bits of data, there are a total of 16 possible combinations of the four bits of data. Accordingly, a memory cell for a QLC memory can be programmed to one of 16 different levels.

In embodiments, the memory system receives a request from a host system to perform a programming operation to store data at the QLC memory (or other memory components having memory cells that store two or more bits). The memory system can store the data by performing multi-pass programming (e.g., two or more programming passes) that programs or stores data at the memory cell. A first programming pass can program data at the memory cell at a particular time. At a later time, a second programming pass can be performed on the memory cell to store additional data at the memory cell. The second programming pass uses the information stored in the first programming pass. A certain amount of time can elapse between the memory sub-system performing the first programming pass and performing the second programming pass on the same memory cell. During a first programming pass of a two-pass programming operation, one or more voltage levels can be applied to the memory cell to program a first set of bits (e.g., 3 bits in 3 logical pages). During a second programming pass of the two-pass programming operation, one or more voltage levels can be applied to the memory cell to program an additional bit to the first set of bits (e.g., 4 bits in 4 logical pages). The level that the memory cell is programmed to in the second programming pass can be based on the last logical page of the memory cell as well as the prior logical pages that were programmed at the memory cell in the first programming pass.

A continuous read level calibration (cRLC) operation continuously samples valley margins between programming distributions. The valley margin can refer to a relative width (also referred to as "margin" herein) between pairs of adjacent programming distributions. For example, valley margins associated with a particular logical page type can indicate the relative width between pairs of programming distributions associated with the particular logical page type. For instance, a first valley margin of an upper logical page (e.g., valley 2 that is between the $2^{nd}$ distribution (L1) and $3^{rd}$ distribution (L2)) that is larger than a second valley margin of the upper logical page (e.g., valley 6 that is between the $6^{th}$ distribution (L5) and the $7^{th}$ distribution (L6)) can indicate that the first valley is larger than the second valley (e.g., valley 2 is larger than valley 3), but does not explicitly recite the absolute width or size of either valley.

Valley margin can be correlated with a read window budget (RWB). Read window budget for a valley can refer to an absolute measurement in volts (e.g., millivolts (mV)) between two adjacent programming distributions. For example, the RWB for valley 2 can be 270 mV and the RWB for valley 6 can be 250 mV. If, for example, the first valley margin is larger than the second valley margin, then a correlation that the RWB of the first valley margin is larger than the RWB of the second valley margin can be made.

In some instances, a value for RWB is not readily measureable. A difference error count (Diff-EC) can be readily measured (e.g., by the cRLC operation) and can be correlated to a valley margin and relative RWB of valleys for a particular logical page type. Diff-EC is a metric derived from measurements taken at a valley between two adjacent programming distributions. In some embodiments, Diff-EC is inversely proportional to valley margin. For example, two valleys of a particular logical page type with the same Diff-EC value have approximately the same valley margin. Since the two valleys have the same valley margin, it can be inferred that the two valleys have approximately the same RWB, even though the absolute RWB is not measured. If a first valley of a first logical page type has a higher Diff-EC than a second valley of the first logical page type, it can be inferred that the first valley has less valley margin than the second valley, and that the first valley has less RWB than the second valley.

The cRLC operation is a read level calibration that can be done for each of the multiple read level threshold registers used during all read operations. A read level threshold register can store a value that indicates the read level threshold voltage for a particular valley. The cRLC operation can be performed to keep each read level threshold centered so that the memory component can achieve the best overall bit error rate (BER) possible. The cRLC operation is referred to as continuous because the operation samples continually and dynamically at discrete intervals. For example, a sample, which can be a set of three reads, can be made at about 1 sample operation in every 1 to 30 seconds, depending on the requirements. Each sample initiated by the cRLC operation returns data for a particular die and a particular logical page type so that over many of these operations the information is aggregated and fed back in a closed loop system such that each die or read level threshold is kept calibrated (e.g., the read level threshold is centered). In one implementation, a sample is three reads from the same read threshold valley (e.g., also referred to as "valley" or "Vt distribution valley" herein). The read level thresholds of the memory component can start with manufacturing default read level thresholds. The cRLC operation can be run during a test mode so that all read level offset trims of all word line groups (WLGs) of all dies in the memory system are calibrated (also referred to as "converged" herein). A memory cell (or WLG or memory component, etc.) that is calibrated or converged by cRLC has a center value that corresponds to a read level threshold (or read level trim) that is centered in or at a lowest point in the read threshold valley. A memory cell (or WLG or memory component, etc.) that is calibrated or converged by cRLC has a center value that results in a lowest bit error rate (BER). BER can refer to a ratio of a number of bits in error of a data vector divided by a total number of bits for the given data vector. BER can correspond to a particular logical page type. For example, a particular logical page type has a particular BER and another logical page type has another BER. A trim can refer to digital value that is used for a circuit, such as a register, that is converted into an analog voltage value. For example, the read level threshold trims can be programmed into a trim register, which produces a read level threshold voltage used to read data from a memory cell.

The cRLC operation measures and collects information about the valley margins, such as the center bit error count (CenterEC) and the difference error count (Diff-EC) measurements. CenterEC is a metric indicative of the average error count for the center sample of each trim (e.g., each read level threshold). Average CenterEC can refer to the average error count for all the read level thresholds of a particular logical page type. Average CenterEC for a particular page logical type can be indicative of a relative BER of the logical page type with respect to other logical page types. For example, a first logical page type is associated with an average CenterEC that is greater than the average CenterEC of a second logical page type. Since the first logical page type has a greater average CenterEC than the second logical page type, it can be inferred that the BER of the first logical page type is higher than the BER for the second logical page type. The cRLC measurements can also be used for various types of program targeting operations (also referred to as "Dynamic Program Targeting (DPT) operations" herein).

A program targeting (PT) operation controls the program verify (PV) target placement such that the programming distributions are placed in a beneficial arrangement. A PV target can refer to voltage value or trim value used to program a memory cell at a given level. The PV target can set a threshold voltage (Vt) (e.g., minimum voltage at which a memory cell turns on or is conductive) of the memory cell. A PV target is associated with a particular programming distribution. For example, multiple memory cells that are programmed at a particular PV target can have threshold voltages that are within the corresponding program distribution. The program distribution can illustrate the range of threshold voltages (e.g., normal distribution of threshold voltages) for memory cells programmed at a particular PV target. The PT operation is a PV targeting calibration that can be done for each PV target. The PT operation can be considered as a set of one or more operations to adjust or calibrate the placement of PV targets. The PT operation calibrates multiple logical page types such that the BER of each logical page type will be approximately the same through the life of the memory system and through all operating environments (e.g., minimizes BER). Additionally, the PT operation calibrates each particular logical page type to equalize the widths of valleys of each particular logical page type such that the RWBs for the valleys of each particular logical page type are approximately the same. For example, the PT operation can adjust the three TLC logical page types; lower logical page (LP), upper logical page (UP), and extra logical page (XP) such that the BER of each of these three logical page types will be approximately the same (i.e., balanced). The PT operation uses the cRLC as the feedback metric in a closed loop feedback system. The PT operation, in addition to balancing logical page type BER, keeps the BER of each logical page type balanced dynamically by performing the PT operation during block programming, such as between the first programming pass and the second programming pass of a multi-pass programming operation on a block. Balancing the BER can reduce the average error correction trigger rate throughout the life of each die, including end-of-life (EOL) conditions. By adjusting PV targets, PT effectively moves the program distributions in the direction of the adjusted PV targets. PT calibration (e.g., adjusting the PV targets) can result in equalization of valley margins of a particular logical page type so that the valley margins are converged at a particular convergence value and the valley margins for a particular page type are roughly the same. PT calibration can also include balancing the BER of each logical page type so that each valley associated with a particular logical page has roughly similar RWB.

The PT operation can increase endurance (i.e., more total Program/Erase cycles) for each die in a memory system. Using the PT operation, no one logical page type will dominate the end of life criteria. The PT operation can be performed independently for each word line group. The PV targets of the memory component can start with manufacturing default PV targets. The PT operation can be run during a test mode so that all PV targets of all word line groups (WLGs) of all dies in the memory system have been balanced (i.e., when the BERs of the logical page types are approximately the same). In the test mode, the cRLC and PT operations can run at an accelerated rate for a short period of time at manufacturing so that each WLG will have optimized and converged the cRLC read level thresholds prior to deployment. The cRLC and PT operations can be performed in an interleaved or concurrent method so that the memory sub-system is continually maintained at its optimum and controlled valley margin through the life of the memory sub-system.

In operational mode (e.g., when in operation in the field), the cRLC and PT operations can be run dynamically to extend the usable lifetime of the memory components of the memory sub-system. The term "dynamic" as used herein can refer to processes, functions, operations, or implementations that occur during operation, usage, or deployment of a corresponding device, system, memory sub-system, or embodiment, and after or while running the manufacturer's or third-party firmware. The dynamically occurring processes, functions, operations, or implementations can occur after or subsequent to design, manufacture, and initial testing, setup or configuration (e.g., after test mode). In some conventional memory sub-systems, PV targets of the memory component are set with manufacturing default PV targets, and the default PV targets are not changed at any point during the life of the memory component. In other conventional memory sub-systems, some PV targets of the memory component are changed dynamically in the field. However, the PV target of the program distribution adjacent (also referred to as the "second program distribution" herein) to the initial program distribution and the last program distribution are not part of the group of PV targets that are allowed to be changed or adjusted.

The initial program distribution (L0) is sensitive to disturb effects, such as program disturb and read disturb. For example, a read disturb is where a read of one row of memory cells impacts the threshold voltages of unread memory cells in different rows of the same block. A program disturb error occurs when one or more memory cells not intended to be programmed are changed (e.g., bits representation is changed) during a program operation on other memory cells that are proximate to the one or more memory cells. The disturb effects can cause the initial program distribution (L0) to move up towards the second program distribution (L1), such that the initial program distribution (L0) and the second program distribution (L2) overlap, which causes bit errors and reduces reliability of the memory component. To compensate for disturb effects a guard band is created between the initial program distribution (L0) and the second program distribution (L1). The guard band refers to unused RWB or margin. For example, a guard band having a fixed margin can be implemented between the initial program distribution (L0) and the second program distribution (L1) so that in the event of disturb event the initial program distribution (L0) and the second program distribution (L1) do not overlap. To maintain the fixed guard band and to avoid potential reliability problems due to disturb effects, conventional memory sub-systems do not adjust the PV target of the initial program distribution (L0) and the second program distribution (L1) after establishing the default PV target settings.

A guard band is also often established between the last program distribution and a top voltage level limit of a memory cell. The top voltage level limit is the highest voltage (e.g., PV target) at which a memory cell can be programmed. If the PV target of the memory cell is set to a voltage level that causes the corresponding program distribution to exceed the top voltage level limit, the memory cell can be programmed to a permanently conductive state. In a permanently conductive state, the memory cell cannot be read or erased, which results in a failure of the memory cell. Additionally, moving the PV target of the last program distribution too high but less than the voltage level limit can negatively affect data retention. For example, the higher voltage of the PV target of the last program distribution can cause the last program distribution to move lower over time and overlap with the second to last program distribution. Data retention can refer to the time period that a memory cell can retain data in an unbiased condition. To maintain the guard band between the last program distribution and the top voltage level limit of the memory, conventional memory sub-systems do not adjust the PV target of the last program distribution after establishing the default PV target setting.

The guard band established between the initial program distribution (L0) and the second program distribution (L1) and the guard band established between the last program distribution and the top voltage level limit allocates a fixed margin or fixed RWB of each memory cell to serve as a respective guard band. The fixed margin or fixed RWB used as a guard band reduces that amount of available margin or RWB used to calibrate a memory cell during the lifetime of the memory cell. The reduction of available margin or RWB used to calibrate a memory cell during the life of a memory cell negatively influences the endurance of the memory cell. Additional available margin or RWB used to calibrate a memory cell can positively influence the endurance of the memory cell, and hence improve the endurance of the memory component. Any available margin or RWB can theoretically be used to adjust program distributions in one direction or another and make the margins between program distributions wider (or more narrow). Having additional available margin increases the ability of the memory sub-system to adjust the PV targets of program distributions (e.g., move program distributions), such that margin between program distribution is maintained over the life of the memory cell even in view of wear effects that shift or spread the program distributions. Endurance can refer to the number of program and erase cycles a memory cell is cable of performing within the useful life of the memory cell.

For example, by allowing for the adjustment of the PV target of the second program distribution and the last programming distributions, the default margin between the initial program distribution and the second program distribution can be initially set at distance that is less than if the initial program distribution and the second program distribution were guard banded. As the memory cell starts to wear over time, the initial program distribution (L0) can drift higher. The PT operation to calibrate the memory cell can compensate for the wear by moving all the PV targets of the program distributions from L1 to the last program distribution up a same magnitude (e.g., in an "accordion-like" manner). The PT operation can continue to calibrate over the life of the memory component. Over time, similar accordion-like calibration operations can be performed until the PV target of the last program distribution hits an upper limit (e.g., before exceeding the top voltage level limit) above which the PV target of the last program distribution is not allowed to exceed. The PT operation can continue to calibrate the memory cell by taking margin from a valley of another logical page type and giving the margin to the valley (V1) between the initial program distribution and the second program distribution. By allowing the PV targets of the second program distribution and the last program distribution to be adjusted over the life of the memory component, the memory component is better able to compensate for wear to its memory cells, which improves endurance of the memory component.

Aspects of the disclosure address the above challenges by performing a program targeting operation to calibrate one or more PV targets associated with the program distributions of a memory cell. The PT operation uses a set of rules that indicate which PV targets to adjust. The set of rules correspond to an adjusting of the second PV target, the last PV target, or both.

In some embodiments, the PT operation determines one or more difference error counts (Diff-EC) that are indicative of relative widths of valleys that are located between programming distributions of a memory cell of the memory component. The Diff-ECs can be received from a cRLC operation. The processing device performs a program targeting operation on the memory cell to calibrate one or more program verify (PV) targets associated with the programming distributions. To perform the program targeting operation, the processing device selects a rule from a set of rules based on the one or more Diff-ECs. The set of rules correspond to an adjusting of a PV target of a second programming distribution, a PV target of a last program distribution, or both.

In some embodiments, the PT operation implements the set of rules to balance the logical page types such that the BER for different logical page types is approximately the same. In selecting a rule form the set of rules, the PT operation identifies two logical page types. Each of the logical page types can have a BER, which can be inferred by an average CenterEC for each of the logical page types. If the BER of the first logical page type is less than the BER of the second logical page type, then a first subset of rules is identified from the set of rules. The first subset of rules includes rules that each give margin to the second logical page type, and take margin from the first logical page type. If the BER of the first logical page type is greater than the BER of the second logical page type, then a second subset of rules is identified from the set of rules. The second subset of rules includes rules that each give margin to the first logical page type, and take margin from the second logical page type. Using the PT operation, logical page types with higher BER are given margin from logical page types with lower BER, such that over time the PT operation balances the BER between the logical page types.

To select a particular rule from the first subset of rules, the PT operation identifies a valley of the second logical page type that has the least margin. The valley of the second logical page type that has the least margin is the valley of the second logical page type that has the highest Diff-EC. The PT operation further identifies a valley of the first logical page type that has the most margin. The valley of the first logical page type that has the most margin is the valley of the first logical page type that has the lowest Diff-EC. The PT operation can identify a rule from the first subset of rules that gives margin to the valley of the second logical page type that has the least margin of any valley of the second logical page type, and takes margin from the valley of the first logical page type that has the most margin of any valley of the first logical page type. The selected rule can identify the PV targets to be adjusted and the magnitude and direction the PV targets are to be adjusted to perform the above aforementioned. As such, the PT operation over time balances the BER between logical page types and equalizes the relative widths of the valleys for a particular logical page type.

To select a particular rule from the second subset of rules, the PT operation identifies a valley of the first logical page type that has the least margin. The valley of the first logical page type that has the least margin is the valley of the first logical page type that has the highest Diff-EC. The PT operation further identifies a valley of the second logical page type that has the most margin. The valley of the second logical page type that has the most margin is the valley of the second logical page type that has the lowest Diff-EC. The PT operation can identify a rule from the second subset of rules that gives margin to the valley of the first logical page type that has the least margin of any valley of the first logical page type, and takes margin from the valley of the second logical page type that has the most margin of any valley of the second logical page type. The selected rule can identify the PV targets to be adjusted and the magnitude and direction the PV targets are to be adjusted to perform the above aforementioned PT operation. As noted above, the PT operation over time balances the BER between logical page types and equalizes the relative widths of the valleys for a particular logical page type.

Being able to adjust the PV targets of the second program distribution and the last program distribution from the default PV targets allows the PT operation to increase the amount of available margin or RWB used to calibrate a memory cell during the memory cell's lifetime. By increasing an amount of margin or RWB available to the PT operation, the PT operation can perform additional PV target adjustments (e.g., as articulated in the set of rules described herein). The additional PV target adjustments that include adjustments to the PV targets to the second program distribution, the last program distribution, or both allows the memory component to better compensate for wear to its memory cells over the memory component's lifetime, which improves endurance of the memory component.

It can be noted that for the sake of illustration, rather than limitation, the PT operation is described as balancing the logical page types and equalizing the valleys of a particular logical page type as described above. It can be noted that in other embodiments, PT operations can be used to control the BER of each logical page type to be different using a scaling factor. PT operations can also be used to control the valley margins of a particular logical page type to be different using a scaling factor. Although the PT operation is described herein balancing logical page types and equalizing the valleys of a particular logical page type, aspects of the present disclosure can be used where the PT operation controls the valley margins of a particular logical page type or the BER between logical page types using a scaling factor.

It can also be noted that for the sake of illustration, rather than limitation, aspects of the present disclosure are described with respect to QLC memory. It can be noted that aspects of the present disclosure can apply to any multi-bit memory, such as TLC, or other multi-bit memory.

FIG. 1 illustrates an example computing environment 100 that includes a memory sub-system 110 in accordance with some embodiments of the disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as a group of memory cells, wordlines, wordline groups (e.g., multiple wordlines in a group), or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (e.g., processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the disclosure, a memory sub-system 110 cannot include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a program targeting component 113 that performs operations as described herein. In some embodiments, the program targeting component 113 can be part of host system 120, controller 115, memory component 112N, an operating system, or an application. Program targeting component 113 can program the PV targets of the second program distribution, the last program distribution, or both. For example, the controller 115 can include a processor 117 (processing device) configured to execute instructions stored in local memory 119 for performing the operations described herein.

Figure 2A:
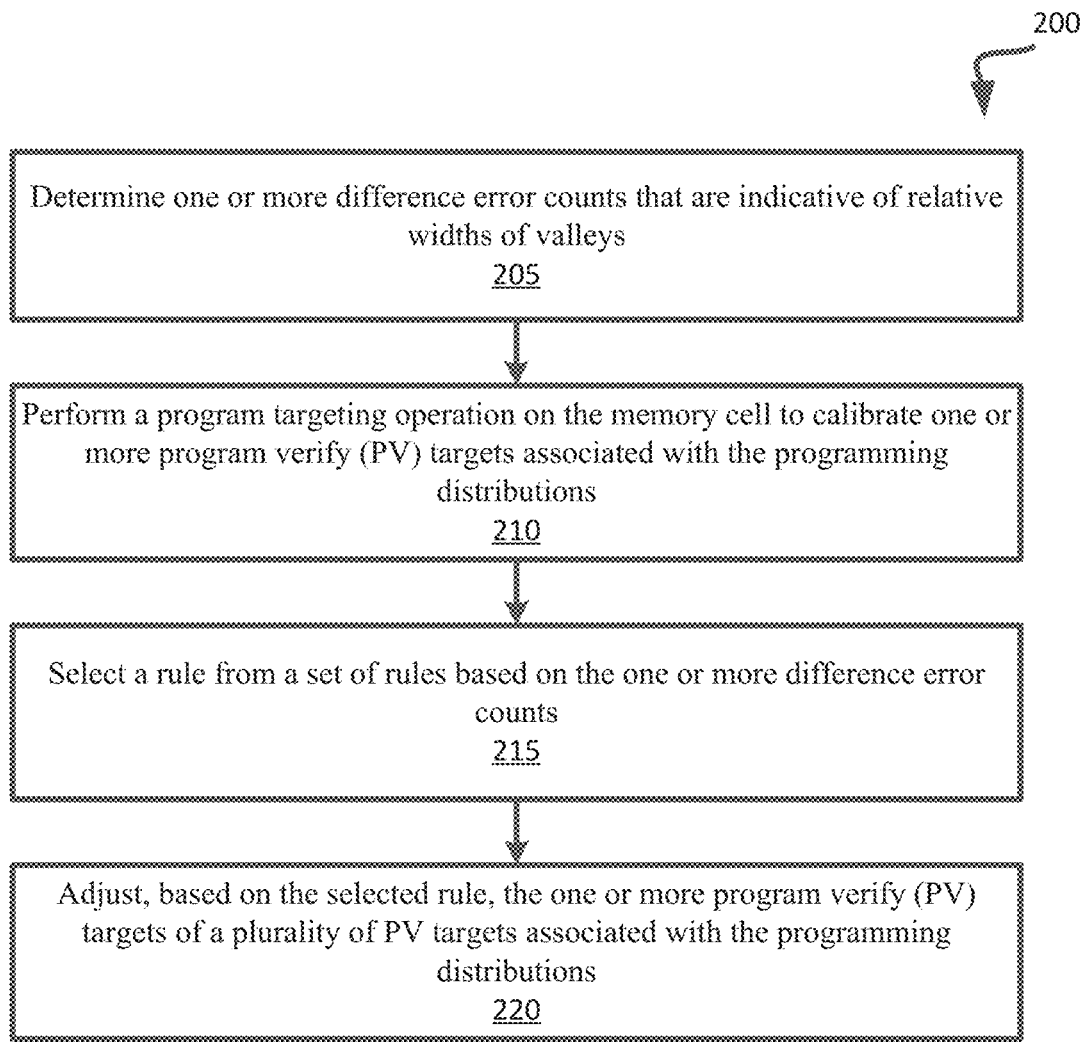
FIG. 2A is a flow diagram of an example method to use a set of rules that correspond to an adjusting of a program verify (PV) target of a programming distribution adjacent to an initial programming distribution or a PV target of a last programming distribution, in accordance with some embodiments of the disclosure.

FIG. 2A is a flow diagram of an example method 200 to use a set of rules that correspond to an adjusting of a program verify (PV) targets of a programming distribution adjacent to an initial programming distribution or a last programming distribution, in accordance with some embodiments of the disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 200 is performed by the program targeting component 113 of FIG. 1. Although shown in a particular order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, different operations can be used.

At operation 205, processing logic determines one or more difference error counts (Diff-EC) that are indicative of relative widths of valleys that are located between programming distributions of a memory cell of the memory component. In embodiments, the difference error count is inversely proportional to the valley widths (e.g., valley margin).

In some embodiments, to determine one or more difference error counts for a difference error, processing logic performs a continuous read level calibration (cRLC) operation on the memory cell to calibrate read level thresholds between the programming distributions.

In embodiments, to perform the cRLC operation on the memory cell to calibrate the read level thresholds between the programming distributions, processing logic adjusts the read level thresholds to a center value that results in a lowest bit error rate. In embodiments, to perform a continuous read level calibration (cRLC) operation on the memory cell to calibrate read level thresholds between the programming distributions, processing logic samples the center value, a positive offset value, and a negative offset value between one or more of the programming distributions of the memory cell. The difference error count for a particular valley is determined using the center value, the positive offset value, and the negative offset value of the valley. The aforementioned values are measurements taken at a valley between adjacent programming distributions. A center value can be the lowest point in the valley. The positive offset value is a positive value (e.g., positive voltage value) from the center value. The negative offset value of the valley can be a negative value (e.g., negative voltage value) from the center value. In some embodiments, the positive offset value and the negative offset value are of the same magnitude. In some embodiments, Diff-EC is the mean of the positive offset value and the negative offset value less the center value. Center value, the positive offset value, and the negative offset value of the valley are further described with respect to FIGS. 3A and 3B.

In one embodiment, when a read sample is taken, three reads are performed in sequence, including a low Vt read, a high Vt read, and a center Vt read. The center Vt read is a register value that is a cRLC center value, the low Vt read is a register value that is the cRLC center value less a negative offset value, and the high Vt read is a register value that is the cRLC center value plus a positive offset value. If a read level threshold were to be swept by a BER sweep, the cRLC center value should be the lowest value in the valley between an adjacent pair of programming distributions. However, when the memory cell is not calibrated, the cRLC center value is not the lowest. In calibration, the cRLC operation centers the cRLC center value by balancing the side samples. In embodiments, in balancing the side samples the positive offset value and negative offset value are of equal magnitude. In some embodiments, to calibrate the read level thresholds, the cRLC operation balances the side samples for at least a particular logical page type. For example, for a particular logical page type all the respective positive offset values and the negative offset values are of equal magnitude for all the respective valleys. When the side samples are nearly equal (balanced), the cRLC center value can become centered at the deepest point in the BER sweep. For the read sample, a difference error count (Diff-EC) can be computed. More specifically, the Diff-EC measurement is the mean of the two side samples minus the center value. The Diff-EC is the difference between the average of the positive and negative offset sample bit error rate counts and the center sample bit error count. Also, the center bit error count (CenterEC) is calculated. These values can be used to determine where the read level threshold should be set. The best BER for a logical page exists when all read level thresholds for that logical page type are centered by cRLC and the RWB for each logical page type valleys are approximately the same. The Diff-EC and CenterEC can be stored and used by the PT operation as feedback information in setting the PV targets. In some embodiments, after cRLC calibrates the read level thresholds between the programming distributions (e.g., second pass programming distributions), processing logic proceed to operation 210. The cRLC operation is further described below with respect to FIG. 3A and FIG. 3B.

At operation 210, processing logic performs a program targeting (PT) operation that calibrates the memory cell by adjusting one or more PV targets associated with the programming distributions. In some embodiments, the program targeting operation implements a set of rules to balance logical page types such that the BER is approximately the same for different logical page types and to equalize relative width of valleys of a particular such that the RWB for the valleys of the particular logical page type are approximately the same. Program targeting operation calibration converges Diff-EC for at least a particular logical page type to a convergence value. For example, after cRLC convergence, the Diff-EC measurements obtained via the cRLC operation are passed to the PT operation. For a TLC memory cell, PT calibration converges the Diff-EC measurements for valleys 1-7 to a convergence value (e.g., Diff-EC of approximately 60) so that each valley has roughly similar RWBs and the different logical page types have a similar BER.

In some embodiments, processing logic can perform the program targeting operation responsive to a satisfaction of one or more conditions. For example in operational mode, the program targeting operation can be performed responsive to satisfying a threshold amount of time (e.g., a threshold number of days since the previous PT operation was performed), In another example, in operational mode, the program targeting operation can be performed responsive to satisfying a threshold number of cRLC operations (e.g., responsive to performing 30 cRLC cycles since the most recent PT operation was performed). In another example, in operational mode, the program targeting operation can be performed responsive to satisfying a threshold number of memory operations (e.g., responsive to X number of write operations).

In some embodiments, to calibrate the one or more PV targets associated with the programming distributions, processing logic determines a net-zero adjustment to at least two PV targets associated with the programming distributions based on two or more difference error counts. Processing logic adjusts the at least two PV targets according to the net-zero adjustment. In some embodiments, not all PV targets are adjusted. For example, the first and last PV targets can be fixed and only the intervening PV targets are adjusted. Net-zero adjustments are further described with respect to FIG. 4.

At operation 215, processing logic in performing the program targeting operation selects a rule from a set of rules based on the one or more difference error counts. In one embodiment, the set of rules corresponds to an adjusting of a PV target of a programming distribution adjacent to an initial programming distribution. In an embodiment, the initial programming distribution corresponding to one of the programming distributions of the memory cell has a lowest PV target of all the program distribution of the memory cell. The program distribution adjacent to the initial program distribution can have the second lowest PV target of all the program distributions of the memory cell. For example, in a TLC (L0-L7) or QLC (L0-L15) memory the set of rules can allow for the adjusting of the PV target for the L1 programming distribution.

In another embodiment, the set of rules corresponds to an adjusting of a (PV) target of a last programming distribution. In some embodiments, the last programming distribution corresponding to one of the programming distributions of the memory cell having a highest PV target. For example, in a TLC (L0-L7) and QLC (L0-L15) memory the set of rules can allow for the adjusting of the PV targets for L7 or L15 programming distributions, respectively.

In some embodiments, to select the rule from the set of rules based on the difference error counts, processing logic selects the rule from the set of rules that identifies the at least two program verify (PV) targets describing an adjusting such that a relative width of a valley that has a lowest Diff-EC of the valleys of a first logical page type is decreased and a relative width of a valley that has a highest Diff-EC of the valleys for a second logical page type is increased. Selecting a rule from a set of rules is further described with respect to FIG. 2B and FIG. 5A through FIG. 5D.

In some embodiments, the set of rules further correspond to a locking of a PV target of a programming distributions corresponding to a highest PV target. For example, in a TLC memory the set of rules can allow for the PV target of last programming distribution (L7) to be locked such that the PV target of the last programming distribution (L7) is not adjusted by the program targeting operation. In another example, in a QLC memory the set of rules can allow for PV target of the last programming distribution (L15) to be locked. Locking can refer to a program distribution or respective PV target that has no rule in the set of rules that allows the program distribution or PV target to move. The program distribution is locked such that the PV target is not adjusted at the PT operation.

Figure 5A:
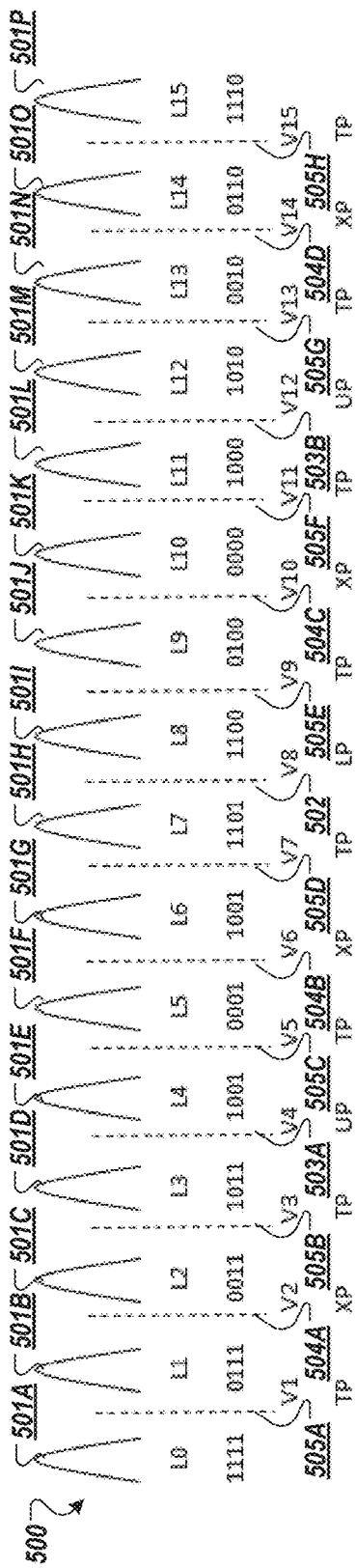
FIG. 5A illustrates a set of rules that correspond to an adjusting of a program verify target of a programming distribution adjacent to an initial programming distribution and to a locking of a PV target of a last programming distribution, in accordance with embodiments of the disclosure.

In some embodiments, the set of rules that corresponds to an adjusting of a PV target of a programming distribution adjacent to an initial programming distribution corresponding to a lowest PV target and to a locking of a PV target of a programming distributions corresponding to a highest PV target is further described with respect to FIG. 5A.

In some embodiments, the set of rules correspond to an adjusting of a (PV) target of a programming distribution corresponding to a highest PV target and a locking of a PV target of a programming distribution adjacent to an initial programming distribution corresponding to a lowest PV target. For example, in a TLC memory the set of rules can allow for the adjusting of the last programming distribution (L7) and a locking of the second programming distribution (L1). In another example, in a QLC memory the set of rules can allow for the adjusting of the last programming distribution (L15) and a locking of the second programming distribution (L1). A set of rules that corresponds to an adjusting of a (PV) target of a programming distribution corresponding to a highest PV target and a locking of a PV target of a programming distribution adjacent to an initial programming distribution corresponding to a lowest PV target is further described in at least FIG. 5B.

In some embodiments, the set of rules correspond to an adjusting of a PV target of a programming distribution adjacent to an initial programming distribution corresponding to a lowest PV target and an adjusting of a PV target of a programming distribution corresponding to a highest PV target. For example, in a TLC memory the set of rules can allow for the adjusting of the second programming distribution (L1) and the last program distribution (L7). In another example, in a QLC memory the set of rules can allow for the adjusting of the second programming distribution (L1) and the last program distribution (L15). A set of rules that corresponds to an adjusting of a PV target of a programming distribution adjacent to an initial programming distribution corresponding to a lowest PV target and an adjusting of a PV target of a programming distribution corresponding to a highest PV target is further described in at least FIG. 5C.

At operation 220, processing logic adjusts, based on the selected rule, the one or more program verify (PV) targets of a plurality of PV targets associated with the programming distributions. In some embodiments, to adjust, based on the selected rule, the one or more program verify (PV) targets of the plurality of PV targets associated with the programming distributions processing logic adjusts at least at least one of the PV target of the second program distribution or the PV target of the last program distribution.

In another embodiment, the memory component includes a block with multiple memory cells organized in wordlines and wordline groups. The memory cell can be a sample memory cell of a first wordline group of the multiple wordline groups. The block can further include a second sample memory cell in a second wordline group of the multiple wordline groups. In embodiments, a program targeting operation can be performed on a wordline group of multiple wordline groups of a block independently from other wordline groups of the multiple wordline groups of the block.

Operations described herein can be performed on a data block (e.g., a group of memory cells), a word line group, a word line, or individual memory cells. For example, the operations described with respect to a memory cell in the disclosure can also be used with a data block that is a group of memory cells.

Figure 2B:
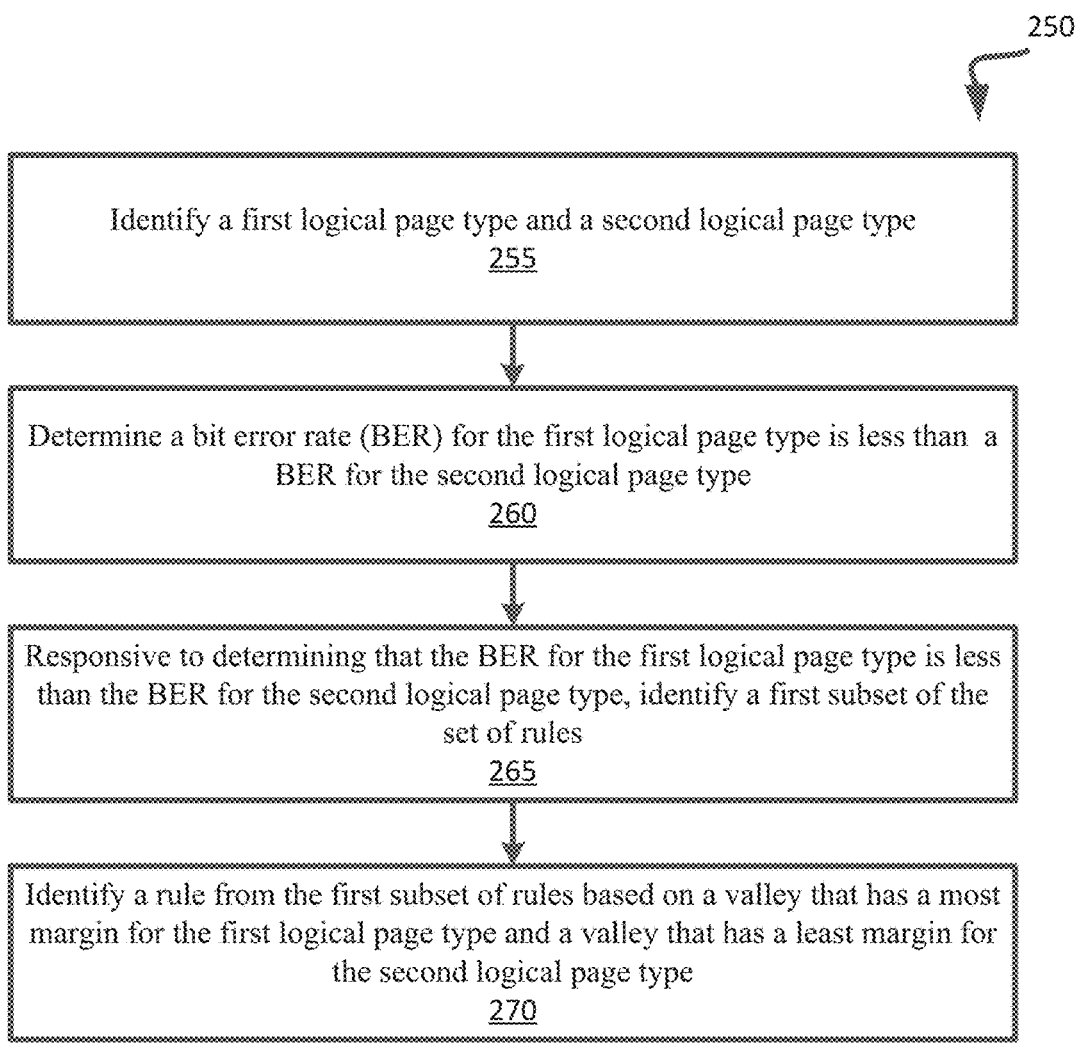
FIG. 2B is a flow diagram of an example method to select a rule from a set of rules, in accordance with some embodiments of the disclosure.

FIG. 2B is a flow diagram of an example method 250 to select a rule from a set of rules, in accordance with some embodiments of the disclosure. The method 250 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 250 is performed by the program targeting component 113 of FIG. 1. Although shown in a particular order, unless otherwise specified, the order of the operations can be modified. Thus, the illustrated embodiments can be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, different operations can be used.

Method 250 illustrates a method of selecting a rule from a set of rules to adjust one or more PV targets as part of a program targeting operation. The set or rules correspond to an adjusting of at least one of a PV target of a programming distribution adjacent to an initial programming distributions or a last programming distribution.

At operation 255, processing logic identifies a first logical page type and a second logical page type. In an example, the first logical page type and the second logical page type are different logical page types. For example, in QLC memory the first logical page type can be an LP and the second logical page type can be a TP, or vice versa.

At operation 260, processing logic can determine whether a bit error rate (BER) for the first logical page type is less than or greater than a BER for the second logical page type. In some embodiments, to determine whether the BER for the first logical page type is less than or greater than the BER for the second logical page type, processing logic compares a first average center bit error count (CenterEC) for the first logical page type to a second average center bit error count for the second logical page type. Processing logic can determine that the BER for the first logical page type is less than the BER for the second logical page type if the first average center bit error count of the first logical page type is less than the second average center bit error count of the second logical page type. Processing logic can determine that the BER for the first logical page type is greater than the BER for the second logical page type if the first average center bit error count is greater than the second average center bit error count. In an example, average CenterEC of a logical page type can be used to infer a relative BER of the particular page type with respect to other logical page types. For example, the average CenterEC of a LP can be compared to the average CenterEC of a TP. If the average CenterEC of the LP is greater than the average CenterEC of the TP, processing logic can infer that the BER of the LP is greater than the BER of the TP.

At operation 265, responsive to determining that the BER for the first logical page type is less than the BER for the second logical page type, processing logic identifies a first subset of the set of rules. The selected rule is from the first subset of rules.

Alternatively, responsive to determining that the BER for the first logical page type is greater than the BER for the second logical page type, processing logic identifies a second subset of the set of rules. The selected rule is from the second subset of rules. For example, if the average CenterEC of the LP is less than the average CenterEC of the TP, processing logic can select a first subset of the rules. If the average CenterEC of the LP is greater than the average CenterEC of the TP, processing logic can select a second subset of the rules.

At operation 270, processing logic identifies a rule from the first subset of rules based on a valley of the first logical page type that has a most margin and a valley of the second logical page type that has a least margin. In embodiments, the one or more difference error counts are used to determine the valley of the first logical page type that has the most margin and the valley of the second logical page type that has the least margin. For example, valley 8 (V8) of the LP can have the most margin (e.g., lowest Diff-EC) out of all the valley of LP. It can be noted that since the LP has only one corresponding valley (V8), V8 can be the valley that has the most margin (e.g., lowest Diff-EC) or the least margin (e.g., highest Diff-EC) for the LP. Continuing the example, one of the valleys (V1, V3, V5, V7, V9, V11, V13, or V15) of the TP can be determined to have the least margin of the valleys of the TP. For purposes of illustration, valley one (V1) of the TP has the least margin. A particular rule of the first subset of rules that corresponds to valley eight (V8) of LP having the most margin and valley one (V1) of TP having the least margin can be selected. It can be noted that valley of logical page type having the most margin is considered the "Least-Needy" valley of the valley(s) of the particular logical page type, and the valley of the logical page type having the least margin is considered the "Most-Needy" valley of the valley(s) of the particular logical page type.

Alternatively, responsive to determining that the BER of the first logical page type is greater than the BER of the second logical page type, processing logic identifies a rule from the second subset of rules based on a valley of that second logical page type that has a most margin and a valley of the first logical page type that has a least margin. For example, valley 8 (V8) of the LP can have the least margin (e.g., highest Diff-EC) out of the valley(s) of LP. One of the valleys (V1, V3, V5, V7, V9, V11, V13, or V15) of the TP can be determined to have the most margin out of the valleys of the TP. For purposes of illustration valley fifteen (V15) of the TP has the most margin. A particular rule of the first subset of rules that corresponds to valley eight (V8) of LP having the least margin and valley fifteen (V15) of TP having the most margin out the valleys of TP can be selected. Selecting a rule from a set of rules to adjust one or more PV targets as part of a program targeting operation is further described with respect to FIG. 5A through FIG. 5D.

Figures 3A, 3B:
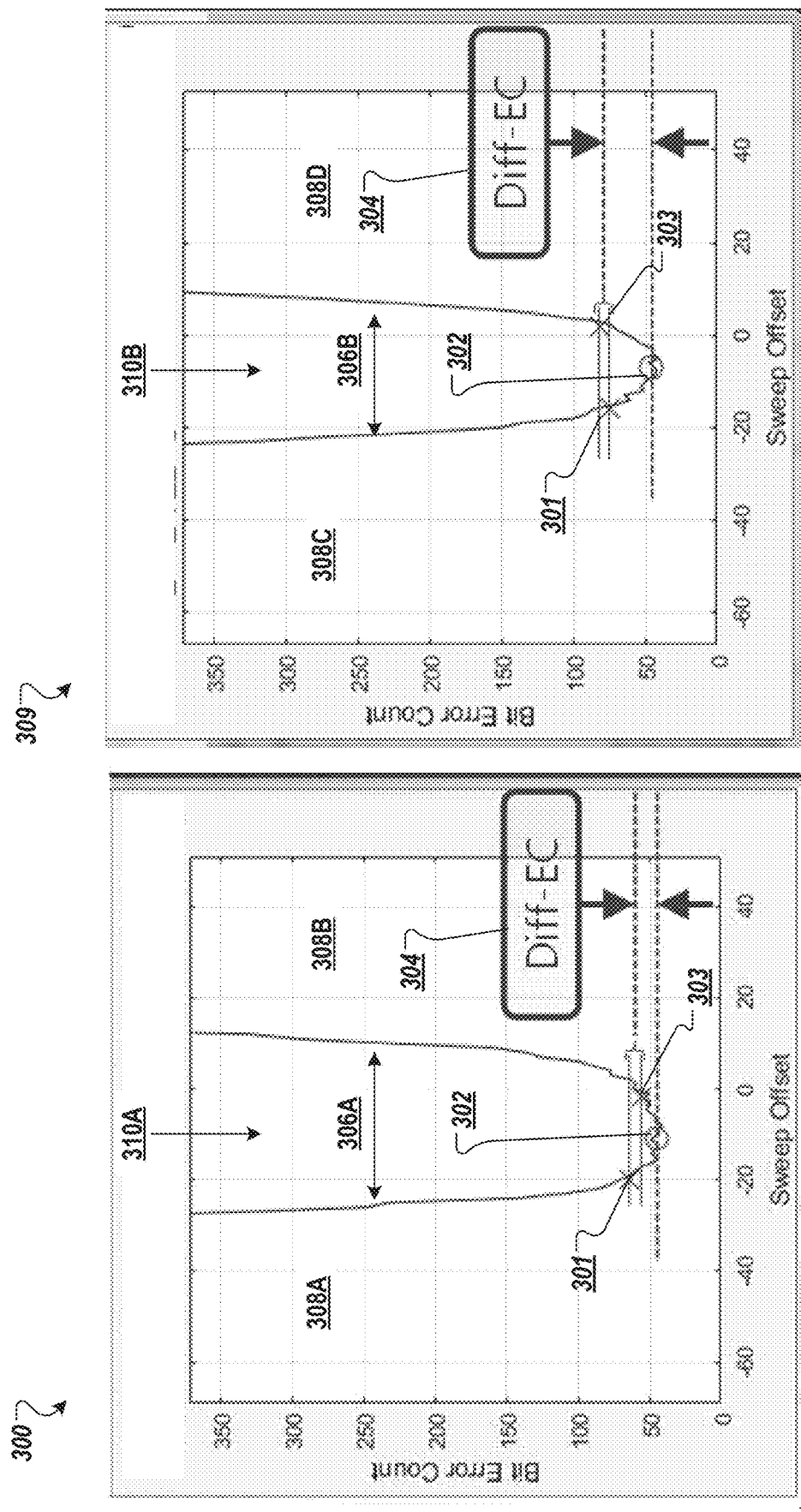
FIGS. 3A-3B illustrate difference error counts of two read level thresholds between two adjacent program distributions, in accordance with some embodiments of the disclosure.

FIGS. 3A-3B illustrate difference error counts of two read level thresholds between two adjacent program distributions, in accordance with some embodiments of the disclosure. Graph 300 shows a valley 310A between a pair of adjacent programming distributions 308A and 308B. Valley 310A-B can refer to the area between two adjacent distributions. Valley margin 306A is also shown between programming distributions 308A and 308B. Graph 309 shows a valley 310B between a pair of adjacent programming distributions 308C and 308D. Valley margin 306B is also shown between programming distributions 308C and 308D. As noted above, valley margin 306A-B can refer to a relative width or relative margin between pairs of adjacent programming distributions. One or more of programming distributions 308A-308D are generally referred to as "programming distribution(s) 308" herein. One or more of valley margins 306A-306B are generally referred to as "valley margin(s) 306" herein. One or more of valleys 310A-310B are generally referred to as "valley(s) 310" herein.

The cRLC operation samples each logical page type in each WLG. Each sample can include 3 reads: low-sample 301 (also referred to as "negative offset value" herein), center-sample 302 (also referred to as "center value" herein), and high-sample 303 (also referred to as "positive offset value" herein). As noted above, the cRLC operation calibrates or converges by obtaining a center value that results in a lowest bit error rate (BER) for a particular logical page type. Convergence is when a read level trim has the value that returns the fewest number of page or code word errors. This is what is called the calibrated or centered value and results in the best BER. In addition to finding the center of the valley 310, the cRLC operation calibrates or converges by balancing the side samples (low-Sample 301 and High-Sample 303) so that that the low-sample 301 and the high-sample 303 are equal in magnitude for a particular valley and the other valleys associated with a particular logical page type. In some embodiments, the low-sample 301 and the high-sample 303 are equal in magnitude for all the valleys for all the logical page types (or for multiple logical page types). In some embodiments, the low-sample 301 and the high-sample 303 are equal in magnitude for at least some valleys of a particular logical page type. Graph 300 and graph 309 show examples of calibrated valleys with the center samples 302 being balanced between the side samples (e.g., the 4 side samples in both graph 300 and 309 are roughly equal in magnitude). Graph 309 demonstrates wide valley behavior and graph 309 demonstrates narrow valley behavior. During cRLC sampling and updating, when the read level trims (e.g., trim registers) are centered, the value of the trim will start "dithering." Anytime a cRLC read level trim changes direction (increasing the trim value, then decreasing the trim value, and vice versa) is considered a dither. This action of dithering indicates the trim is centered. When dithering occurs for a trim, the center value will be set.

The center-samples 302 are used as feedback metrics by PT to equalize the LP/UP/XP error rates by moving PV targets slightly. For instance, the cRLC operation also obtains the center bit error count (CenterEC) by averaging the error count for the center sample of each trim (e.g., read level threshold). But, center-samples 302 are enough to equalize the BER between the logical page types (LP/UP/XP). For each logical page type, the valley margin can also have a reasonable match. The default PV targets can determine the depths of the valleys 310 between the program distributions 308, the depths being related to valley margin 306 of each valley 310. To determine the valley margin 306 of a program distribution 308, the cRLC operation can determine values of a metric that is indicative of the width (or depth) between adjacent pairs of programming distributions 308. In some embodiments, the metric is a difference error and values of the metric are difference error counts (Diff-EC) (also referred to as "Diff-EC measurement(s)"

herein). The difference error can be inversely proportional to the valley margins. For example, as illustrated the Diff-EC of graph 300 is smaller than the Diff-EC of graph 309, and valley margin 306A of graph 300 is larger than valley margin 306B of graph 309. The cRLC operation can determine the Diff-EC measurements 304. The Diff-EC measurements 304 can be used to identify relative valley margins. The Diff-EC measurements 304 can be the mean of the two side samples 301, 303 minus the center value 302. The PT operation can perform BER leveling by moving PV targets to match not only the error counts between logical page types (e.g., balancing), but also match the valley margins within each logical page type (or within all the logical page types) (e.g., equalizing). It can also be noted that valley margin can be correlated to valley depth (e.g., from peak to trough between program distributions). For example, a deep valley can correlate to a narrower valley margin as compared to a shallow valley (e.g., less deep valley) that correlates to a wider valley margin.

It can be noted that the ECs of the center-samples 302 match when multiple valleys associated with logical pages are being measured (UP & XP). It can also be noted that the center-sample bit EC (also referred to as "center bit error count" or "CenterEC") can be the error count of the center-sample 302 (e.g., vertical axis of graph 300 and 309). Despite the center-sample ECs matchings, the valley margin (or depth) can be dramatically different even within the valley of different logical page types (UP & XP). To determine which valley has the largest valley margin or the smallest valley margin, the measure of Diff-EC can be reliably used. The higher the Diff-EC measurement 304, the narrower the valley margin (or the RWB is smaller). The offsets between the Low-Sample 301, Center-Sample 302, and High-Sample 303 for different Diff-EC measurements 304 are equal for purposes of comparison. In some embodiments, the cRLC operation can keep multiple samples (e.g., 16 samples) of each cRLC trim of each die. Once all the cRLC trim is centered, the center-samples 302 (and the corresponding CenterEC) and Diff-EC measurements 304 can be stored for a subsequent execution of a PT operation.

As illustrated, the example of FIG. 3A has a lower Diff-EC measurement 304 than the example of FIG. 3B, which means the program distributions have a larger valley margin and is less-needy. The terms More-Needy and Less-Needy refer to the relative valley margins of valleys which apply to the same logical page type within a WLG. In other words, the Most-Needy valley for a logical page type will be the one that is dominating the Error Count or causing more BER loss than any other valley. The Diff-EC measurements can be used to determine More-Needy vs. Less-Needy valleys, including the order of Needy-Ness (most to least needy). For example, for a particular logical page type the valley with the largest Diff-EC is the Most-Needy valley (has the smallest valley margin) of the valley(s) of the particular logical page type. In another example, for a particular logical page type the valley with the smallest Diff-EC is the Least-Needy valley (has the largest valley margin) of the valley(s) of the particular logical page type. When a TLC page stack page BER is balanced, the LP (L3/L4) will have the lowest RWB, the UP (L1/L2 and L5/L6) will be a bit higher and should be about equal, and XP (L2/L3, L4/L5, and L6/L7, notice that L0/L1 is ignored because it is special) will be the highest RWB. Accordingly, the valleys of LP will have the lowest valley margins, the valleys of UP will have a bit higher valley margin, and the valleys of XP will have the highest valley margin. It should be noted that a balanced BER causes the RWB to gravitate (e.g., equalize) to a value where the RWB for valleys of a particular logical page type are approximately the same, which occurs as a natural byproduct of the PT operation.

Figure 4:
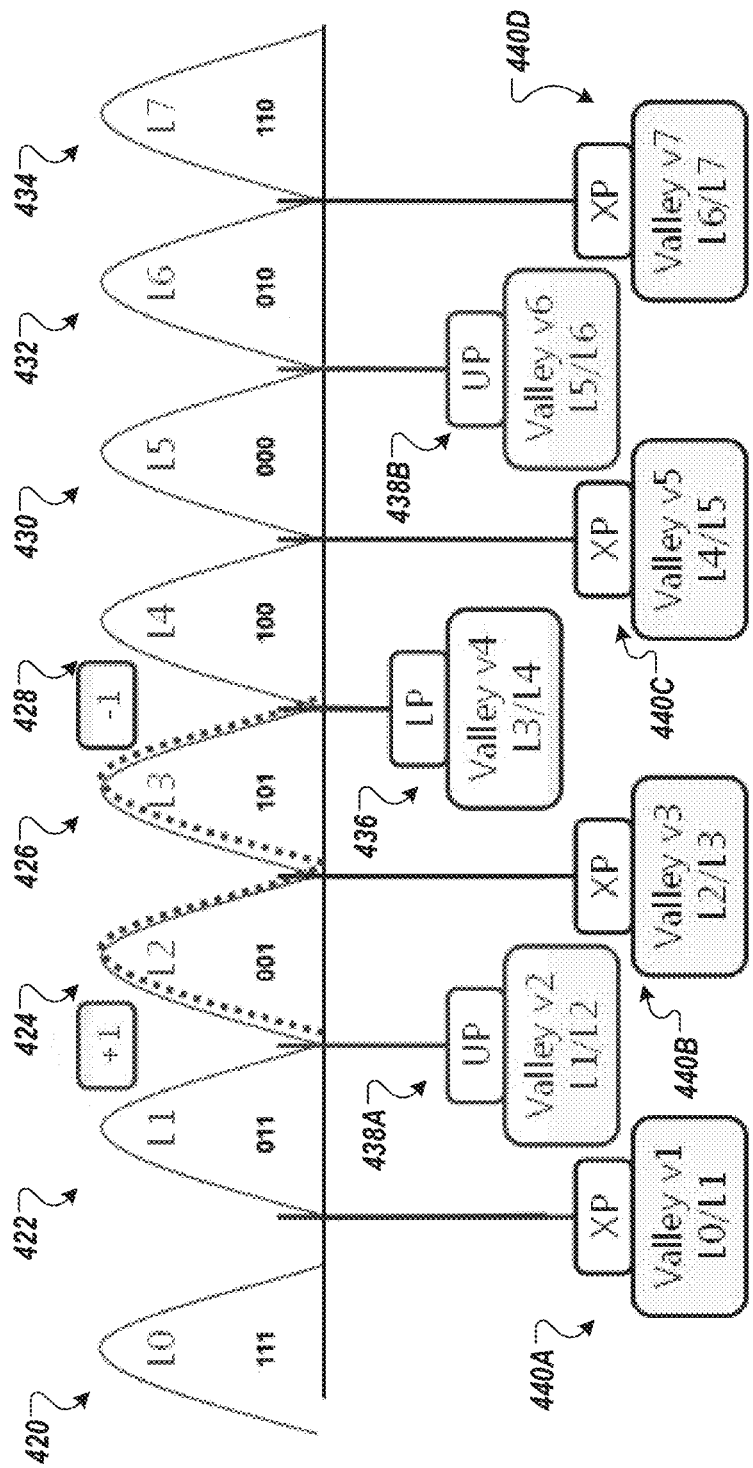
FIG. 4 illustrates eight programming distributions, including two programming distributions after at least two of program verify targets are adjusted according to a program targeting (PT) operation, in accordance with some embodiments of the disclosure.

FIG. 4 illustrates eight programming distributions, including two programming distributions after at least two of PV targets are adjusted according to a PT operation, in accordance with some embodiments of the disclosure. As illustrated in FIG. 4, most of the data in each block is stored as TLC information, including 3 bits per cell. This is accomplished using eight programming distributions 420-434. A lower logical page (LP) is defined with one read level threshold 436 (e.g., approximately at the center between programming distributions 426 and 428). An upper logical page (UP) is defined with two read level thresholds 438A and 438B (generally referred to as "read level threshold(s) 438" herein). An extra logical page (XP) is defined with fourth read level thresholds 440A-440D (generally referred to as "read level threshold(s) 440" herein). The eight programming distributions 420-434 each correspond to a level (L0:L7), each level corresponding to a code (000:111). Between each pair of eight programming distributions 420-434 is a valley, totaling seven valleys (v1:v7). A center or peak of each programming distribution 420-434 corresponds to a PV target for the respective programming distribution 420-432. In total, there can be eight PV targets for a 3-bit representation. In some embodiments, the first programming distribution 420, corresponding to the first level L0, has a fixed PV target. The second programming distribution 422, corresponding to the second level L1, has fixed PV target and the last programming distribution 434, corresponding to the eight level L7, has an adjustable PV target. In some embodiments, the last programming distribution 434, corresponding to the eighth level L7, can have a fixed PV target and second programming distribution 422, corresponding to the second level L1, has and adjustable PV target. In some embodiments, both the second programming distribution 422, corresponding to the second level L1, and the eighth programming distribution 434, corresponding to the eight level L7, have adjustable PV targets. Aspects of the present disclosure allow one or more of a PV target of a programming distribution (e.g., programming distribution 422) adjacent to an initial programming distribution (e.g., programming distribution 420) corresponding to a lowest PV target or a PV target of a programming distribution (e.g., programming distribution 434) corresponding to a highest PV target to be adjusted using a set of rules, as described herein. Using PT operations, the PV targets of the programming distributions, corresponding to levels L1-L7, can be adjusted. It can be noted that FIG. 4 illustrates increasing voltage levels from right to left. For example, the programming distribution 420 has the lowest voltage level and is associated with the lowest PV target, and programming distribution 422 has the second lowest voltage level and the second lowest PV target. Programming distribution 434 has the highest voltage level and the highest PV target.

In the depicted embodiment, the PT operation starts with each PV target in a default state as defined by factory settings. In some cases, all PV targets are adjusted, but in other embodiments, one or more of the first PV target of the initial program distribution (L0), the second PV target of the second program distribution (L1) and the last PV target of the last program distribution (L7) can be fixed, allowing the intervening PV targets to be adjusted. For example, with eight PV targets (of L0-L7), the L0 and L7 PV targets are fixed and the other PV targets L1 through L6 can receive characterized starting values, leading to faster cRLC and PT operation conversion. Alternatively, the L0, and L7 PV targets are fixed and the other PV targets L1-L6 can be adjusted. These factory settings of the PV targets and read level thresholds can produce undesirable BER results before cRLC and PT operations.

In some embodiments, the PT operation can be defined as a net-zero PV target adjustment mechanism. Net-zero adjustments maintain a constant RWB for a memory cell. The total RWB for a memory cell of a multi-bit memory cell is constant, but the RWB between programming distributions can be adjusted by changing PV targets. Net-zero adjustments manages PV target adjustments for optimum BER and logical page type BER matching. The PT operation performs PV target adjustments in order to balance logical page type BER for improved BER sigma continuously throughout the life of a memory component or memory system. The PT operation, as described herein, can be performed between programming passes of a multi-pass programming operation, such as after a first programming pass or a second programming pass. The cRLC calibration is performed in order to perform a subsequent PT operation. The cRLC measures and collects center bit error count (CenterEC) and difference error count (Diff-EC) information on the page stack and passes the information to a subsequent PT operation. Both cRLC and PT can be performed while a block is being programmed rather than after a block is fully programmed.

In embodiments, during programming of the selected block used for PT, the programming sequence is interrupted to perform cRLC. Programming interruption occurs at each logical page stack (selected as one of the cRLC logical page stacks). A logical page stack can refer to all the logical page types for a particular multi-bit memory cell. The program interruption occurs just before the second-pass programming when the first-pass distributions have fully aggressed floating gate coupling from their neighbors. During block programming each of the cRLC page stacks in each of the wordline groups is interrupted and a cRLC is performed until all read level thresholds of the page stack are centered. The cRLC information from each valley, Center Bit Error Count (CenterEC) and Difference Error Count (Diff-EC), is passed to the PT operation for determining Program Verify (PV) Target adjustments according to the PT rules. PV target adjustments are applied to the next block that is programmed and this process of interrupting and cRLC/PT continues as PT converges and finally dithers and then tracks NAND behavior. As noted above, by adjusting PV targets, PT effectively moves the program distributions in the direction of the adjusted PV targets. PT calibration (e.g., adjusting the PV targets) can result in valley margins of a particular logical page type to converge at a particular convergence value so that the valley margins for a particular logical page type are roughly the same. PT calibration can include balancing the BER of each logical page type so that each logical page type has roughly similar BER. During PT PV target adjustment, when that value of the PV trim starts "dithering" (anytime a PV trim changes direction (increasing the trim value, then decreasing the trim value, and vice versa) is considered a dither), the PT operation for the respective program distribution has converged.

A program target offset is defined as the difference in position of a PV distribution relative to the default starting value. For example, the PV targets for L2 and L3 first slew to the right by a certain amount (e.g., by about 130 mv) and then stop slewing and start dithering, which is stabilization (or calibrated). The valley after L3 is the L3/L4 valley (v4), the center value of which is the read level threshold 436 (corresponding to the LP Read Level). This movement is caused by equalizing the BER of the LP page with respect to other logical pages. All PV targets can be stabilized after a number of P/E cycles (e.g., ~40 P/E cycles). It can take some time to stabilize the PV targets as the operation alternates between LP/UP and LP/XP adjustments with a maximum movement of 1 click (e.g., 10 mv). It is possible to characterize these offsets in many die, producing a head start set of offsets, providing BER equalization at time zero.

As described herein, BER balancing can be performed as a net-zero adjustment. As illustrated in FIG. 4, one click (e.g., 10 mv) is given to one level (e.g., labeled as +1) and one click (10 mv) is taken from another level (e.g., labeled as −1). PT operations can adjust both UP and XP (and TP in QLC memory) relative to LP, resulting in BER balancing and RWB equalization of all three TLC logical page types (or all four logical page types in QLC memory). It should be noted that it is possible to give more RWB to higher distributions if required for undesirable NAND behavior like retention for example.

FIG. 5A illustrates a set of rules that correspond to an adjusting of a PV target of a programming distribution adjacent to an initial programming distribution and to a locking of a PV target of a last programming distribution, in accordance with embodiments of the disclosure.

Diagram 500 illustrates sixteen programming distributions of a QLC memory. The data in each block is stored as QLC information, including 4 bits per cell. This is accomplished using sixteen programming distributions 501A through 501P (generally referred to as "programming distributions 501"). A lower logical page (LP) is defined with one read level threshold 502 (e.g., approximately at the center between programming distributions 501H and 501I). An upper logical page (UP) is defined with two read level thresholds 503A and 503B (generally referred to as "read level threshold(s) 503" herein). An extra logical page (XP) is defined with fourth read level thresholds 504A-504D (generally referred to as "read level threshold(s) 504" herein). A top logical page (TP) is defined with eight read level thresholds 505A-505H (generally referred to as "read level threshold(s) 505" herein). The sixteen programming distributions 501A-501P each correspond to a level (L0: L15), each level corresponding to a code (0001:1111). In some embodiments, the code represents gray code. Gray code refers to a binary numeral system were two successive valleys differ in only one bit (e.g., binary digit). It can be noted that in other embodiments, a different gray code can be used. Between each pair of sixteen programming distributions 501A-501P is a valley, totaling fifteen valleys (V1: V15). Each of the valleys (V0:V15) are located between two adjacent programming distributions. For example, valley one (V1) is located between programming distributions 501A and 501B, and valley fifteen (V15) is located between programming distributions 501O and 501P. Each of the read level thresholds is centered in a corresponding valley (V1: V15). For example, read level threshold 502 is centered in valley eight (V8), read level threshold 505A is centered in valley one (V1), and so forth. A center or peak of each programming distribution 501A-501P corresponds to a PV target for the respective programming distribution 501A-501P. In total, there can be sixteen PV targets for a 4-bit representation. In some embodiments, the first programming distribution 501A, corresponding to the first level L0, has a fixed PV target. The second programming distribution 501B, corresponding to the second level L1, has fixed PV target and the last programming distribution 501P, corresponding to the sixteenth level L15, has an adjustable PV target. In some embodiments, the last programming distribution 501P, corresponding to the sixteenth level L15, can have a fixed PV target and second programming distribution 501B, corresponding to the second level L1, has and adjustable PV target. In some embodiments, both the second programming distribution 501B, corresponding to the second level L1, and the last programming distribution 501P, corresponding to the sixteenth level L15, have adjustable PV targets.

Aspects of the present disclosure allow one or more of a PV target of a programming distribution (e.g., programming distribution 501B) adjacent to an initial programming distribution (e.g., programming distribution 501A) corresponding to a lowest PV target or a PV target of a programming distribution (e.g., programming distribution 501P) corresponding to a highest PV target to be adjusted using a set of rules, as described herein. Using PT operations, the PV targets of the intervening programming distributions, corresponding to levels L1-L15, can be adjusted. It can be noted that the diagram 500 illustrates increasing voltage levels from right to left. For example, the programming distribution 501A has the lowest voltage level and is associated with the lowest PV target, programming distribution 501B has the second lowest voltage level and the second lowest PV target. For the sake of clarity, a programming distribution adjacent to an initial programming distribution corresponding to a lowest PV target is also referred to as the "second programming distribution" herein. A programming distribution (e.g., programming distribution 501P) corresponding to a highest PV target is also referred to the as the "last programming distribution" herein.

Set of rules 510 illustrates rules where the second program distribution (L1) is allowed to move, and the last programming distribution (L15) is locked. It can be understood that the movement of a PV target associated with a particular program distribution effectively moves the program distribution in the same direction and in equal magnitude that the PV target is moved. The set of rules 510 illustrate rules for performing a programming target operation (e.g., PT calibration). The set of rules 510 allows the program targeting operation to identify which PV targets to move, and in which direction and magnitude to move the identified PV targets. As noted above, the program targeting operation implements the set of rules to balance logical page types such that a bit error rate (BER) is approximately the same BER for different logical page types, and to equalize relative widths of valleys of a particular logical page type such that read window budgets (RWB) for the valleys of the particular logical page type are approximately a same RWB.

BER equalization can be performed as a net-zero adjustment. The program targeting operation can adjust UP, XP and TP relative to LP, resulting in equalization of all four QLC logical page types. For example, the valley margin for the LP can be reduced by one voltage trim level (e.g., -10 mV) and a valley margin of the XP can be increased by one voltage trim level (+10 mV) (or vice versa), such that a net-zero adjustment is performed. The column 511 illustrates set of rules are for TP-LP adjustments, such that that the TP is adjusted relative to the LP in a net-zero adjustment as described above. The set of rules 510 includes sixteen rules illustrated by cases 13-28. It can be noted that rules and cases are used interchangeably herein. Cases 1-12 are not illustrated, and apply to the adjustment of UP and XP relative to LP. Cases 1-12 are illustrated in FIG. 5D. In QLC memory, the TP page corresponds to the second program distribution and the last program distribution, the PV target adjustments for which are addressed in cases 13-27 of the set of rules 510. Cases 1-12 do not correspond to the movement of the second program distribution and the last program distribution, and are not illustrated with respect to FIG. 5A, so as to not obscure aspects of the present disclosure. It can be noted that for TLC memory, the XP corresponds to the second program distribution and the last program distribution. A set of rules for XP-LP in TLC memory that adjust the second program distribution and the last program distribution corresponding to the XP of the TLC memory can be implemented in accordance with aspects of the disclosure. It can be noted that a QLC memory is described herein for purposes of illustration, rather than limitation. It can be further noted that aspects of this disclosure can apply to different multi-bit memory cells, such as TLC memory.

In some embodiments, to perform a program targeting operation to calibrate one or more PV targets associated the program distributions 501 of a memory cell, a rule from set of rules 510 can be selected. The rule can identify which PV targets to adjust and the magnitude and direction of the adjustment (e.g., ±10 mV). It can be noted that the operations described with respect to FIG. 5A can be performed by program targeting component 113 as illustrated in FIG. 1.

In some embodiments, to select a rule from the set of rules, program targeting component 113 selects the rule from the set of rules 510 that identifies an adjusting of at least two program verify (PV) targets such that a relative width of a valley that has a lowest Diff-EC of a first logical page type is decreased and a relative width of a valley that has a highest Diff-EC of a second logical page type is increased. For example, in a TLC memory the first logical page type can be the LP, and the second logical page type can be the XP. The XP is associated with four valleys (V2, V6, V10, and V14). A valley of the XP having the highest Diff-EC (e.g., V2) as compared to the other valleys (e.g., V6, V10, and V14) of the XP can be identified. A valley (V8) of the LP having the lowest Diff-EC can be identified (e.g., note that LP is associated with only one valley, which can considered the valley of LP with the highest or lowest Diff-EC). A rule that decreases the valley margin for V8 of LP and increases the valley margin for V2 of XP can be identified from the set of rules 510. The selected rule can identify the PV targets to adjust and the magnitude and direction of the adjustment, and program targeting component 113 can adjust the PV targets according to the identified rule.

In some embodiments, to select a rule form set of rules 510, the program targeting component 113 identifies a first logical page type and a second logical page type. For example, in a QLC memory the program targeting component 113 can identify the TP and the LP. In some embodiments, for QLC memory the program targeting component 113 can identify the two logical page types as one of the following: TP-LP, XP-LP, and UP-LP. It can be noted that in some embodiments, the selection of the two logical page types can be based on a particular order. For example, the program targeting component 113 can adjust the TP-LP, followed by the XP-LP, followed by UP-LP, and so forth. It can also be noted that different sets of rules can be used for XP-LP, and UP-LP, which are described with respect to FIG. 5D.

In some embodiments, to select a rule from the set of rules 510, the program targeting component 113 determines whether a BER for the first logical page type (e.g., LP) is less than or greater than a BER for the second logical page type (e.g., TP). In some embodiments, to determine whether the BER for the first logical page type is less than or greater than the BER for the second logical page type, program targeting component 113 compares a first average center bit error count (CenterEC) for the first logical page type to a second average center bit error count (CenterEC) for the second logical page type. The average CenterEC for a particular page type is indicative of the BER of the particular logical page type. In an example, the average CenterEC of the LP can be compared to the average CenterEC of the TP. The BER for the first logical page type (e.g., LP) is less than the BER for the second logical page type (TP) if the first average CenterEC is less than the second average CenterEC. The BER for the first logical page type (e.g., LP) is greater than the BER for the second logical page type (e.g., TP) if the first center bit error count (e.g., average CenterEC) is greater than the second center bit error count (e.g., CenterEC).

In some embodiments, responsive to determining that the BER for the first logical page type (e.g., LP) is less than the BER for the second logical page type (e.g., TP), program targeting component 113 identifies a first subset (e.g., LP<TP) of the set of rules 510. The selected rule is from the first subset of rules. For example, column "Average CenterEC" illustrates a first subset of the rules (e.g., cases 13-20) to apply when the BER (e.g., lower average CenterEC) of the LP is less than the BER (e.g., higher average CenterEC) for the TP.

In some embodiments, responsive to determining that the BER for the first logical page type (e.g., LP) is greater than the BER for the second logical page type (e.g., TP), program targeting component 113 identifies a second subset (e.g., TP<LP) of the set of rules 510. The selected rule is from the second subset of rules. For example, column "Average CenterEC" illustrates a second subset of the rules (e.g., cases 21-28) to apply when the BER (e.g., higher average CenterEC) of the LP is greater than the BER (e.g., lower average CenterEC) for the TP.

In some embodiments, subsequent to identifying the subset of rules, program targeting component 113 can select a rule from the identified subset of rules. In some embodiments, to identify the rule from the first subset of rules (e.g., cases 13-20), program targeting component 113 identifies a rule from the first subset of rules based on a valley (V8) that has a most margin for the first logical page type (e.g., LP) and a valley that has a least margin for the second logical page type (e.g., TP). In some embodiments, one or more difference error counts are used to determine the valley that has the most margin for the first logical page type (e.g., LP) and the valley that has the least margin for the second logical page type (e.g., TP).

In some embodiments, to identify the rule from the second subset of rules (e.g., cases 21-28), program targeting component 113 identifies a rule from the second subset of rules based on a valley that has a most margin for the second logical page type (e.g., TP) and a valley that has a least margin for the first logical page type (e.g., LP). In some embodiments, one or more difference error counts are used to determine the valley that has the most margin for the second logical page type (e.g., TP) and the valley that has the least margin for the first logical page type (e.g., LP).

Column 512 and column 513 of set of rules 510 illustrated "Neediness" of valleys for a particular logical page type. Neediness is based on the Diff-EC measurement. A lower Diff-EC measurement for a particular valley of a logical page type means that the particular valley has a larger valley margin and is less-needy that another valley of the same logical page type that has a higher Diff-EC measurement. The terms More-Needy and Less-Needy refer to the relative valley margins of valleys of the same logical page type. In other words, the Most-Needy valley for a logical page type will be the one that is dominating the Error Count (CenterEC) or causing more BER loss than any other valley of the same logical page type. The Diff-EC measurements can be used to determine More-Needy vs. Less-Needy valleys, including the order of Neediness (Most to Least Needy). For example, for a particular logical page type the valley with the largest Diff-EC is the Most-Needy valley (e.g., has the smallest valley margin) of the valley(s) of the particular logical page type. In another example, for a particular logical page type the valley with the smallest Diff-EC is the Least-Needy valley (e.g., has the largest valley margin) of the valley(s) of the particular logical page type.

As noted above, the program targeting operation calibrates a memory cell by balancing the logical page types such that the BER is approximately the same between the logical page types. To balance the BER, some of the RWB of a logical page type that has a lower BER will be given to a different logical page type with a higher BER. In particular, the margin of Least Needy valley of the logical page type that has the lower BER will be decreased, and the margin of the Most Needy valley of the logical page type that has the higher BER will be increased in a net-zero adjustment. It can be noted that the since the BER of the LP is less than the BER of the TP, the first subset of the set of rules include rules that give RWB to the TP, and take RWB from the LP in a net-zero adjustment. In cases where the BER of the LP is greater than the BER of the TP, the second subset of rules include rules that give RWB to the LP, and take RWB from the TP in a net-zero adjustment.

In an example, program targeting component 113 identifies the LP and the TP as the two logical page types on which to perform a program targeting operation. Program targeting component 113 identifies the set of rules 510 that apply to performing a program targeting operation on the LP and TP logical page types (e.g., LP-TP Update). The program targeting component 113 determines that the BER for the LP is less than the BER for the TP. In order to make the aforementioned determination, the program targeting component 113 determines the average CenterEC for the LP is less than the average CenterEC for the TP. The average CenterEC for the LP being less than the average CenterEC for the LP indicates that the BER for the LP is less than the BER for the TP. By determining that average CenterEC is for the LP is less than the average CenterEC for the TP, program targeting component 113 identifies a first subset (e.g., LP<TP, which identifies cases 13-20) of the set of rules 510 that apply if the BER for the LP is less than the BER for the TP. To identify a specific rule from cases 13-20, program targeting component 113 identifies the Most Needy Valley of the TP and the Least Needy valley of the LP. The Most Needy valley of the TP is the valley that has the least relative width (e.g., the least margin) and the highest Diff-EC of the all the valleys of the TP. The Least Needy valley of the LP is the valley that has the largest relative width (e.g., the most margin) and the lowest Diff-EC for all the valleys of the LP. In a particular instance, valley one (V1) of the TP has the highest Diff-EC of all the valleys of the TP and is the Most Needy valley, and valley eight (V8) of the LP has the lowest Diff-EC of all the valleys of the LP and is the Least Needy valley. In the aforementioned condition, case 13 can be identified as the rule in the first subset of set of rules 510 to apply (e.g., see columns 512 and 513 indicating Most Needy valley and Least Needy valley combinations).

In case 13 of set of rules 510, one voltage trim level (e.g., 10 mv) is given to the PV targets of program distributions L1:L7 (e.g., labeled as +1). The program distributions L1:L7 are moved in an accordion-like manner, such that all the PV targets of program distributions (L1:L7) are moved in the same direction and same magnitude. It can be noted that in case 13, RWB is given to valley 1 (V1) of the TP as PV target of the programming distribution L1 is moved to the right. Valleys V2:V7 experience no change in relative width (or RWB) since all the PV targets for program distributions L1:L7 shift to right by the same magnitude and direction (e.g., to the right by +10 mV). The corresponding valleys V2:V7 shift to the right a corresponding amount, but do not change in relative width. RWB is taken from valley 8 (V8) of the LP as the PV target of program distribution L7 is moved to the right and the PV target of program distribution L8 remains stationary. Valley 8 (V8) of the LP is squeezed to give margin to valley 1 (V1) of the TP in a net-zero adjustment.

It can be noted that case 21 of the set of rules 510, is the opposite of case 13. In case 21, the BER of the LP is greater than the BER of the TP. The Most Needy valley of the LP is valley 8 (V8) of the LP, and the Least Needy valley of the TP is valley 1 (V1). In case 21, one voltage trim level (e.g., 10 mv) is taken from the PV targets of program distributions L1:L7 (e.g., labeled as −1). The program distributions L1:L7 are moved in an accordion-like manner, such that all the PV targets of program distributions (L1:L7) are moved in the same direction and same magnitude. It can be noted that in case 21, RWB is taken from valley 1 (V1) of the TP as the PV target of the programming distribution L1 is moved to the left. Valleys V2:V7 experience no change in relative width (or RWB) since all the PV targets for program distributions L1:L7 shift in the same direction and by the same magnitude (e.g., left by −10 mV). The corresponding valleys V2:V7 simply shift to the left a corresponding amount, but do not change in relative width. RWB is given to valley 8 (V8) of the LP as the PV target of program distribution L7 is moved to the left (e.g., 10 mV) and the PV target of program distribution L8 remains stationary. Valley 1 (V1) of the TP is squeezed to give margin to valley 8 (V8) of the LP in a net-zero adjustment.

It can be further noted that set of rules 510 are rules where program distribution L15 is locked such that the PV target of program distribution L15 is not adjusted by the program targeting operation. The "0"s that are placed in the column designated by "L15" are used to illustrate that PV targets of program distribution L15 are not allowed to be adjusted during a program targeting operation.

Figure 5B:
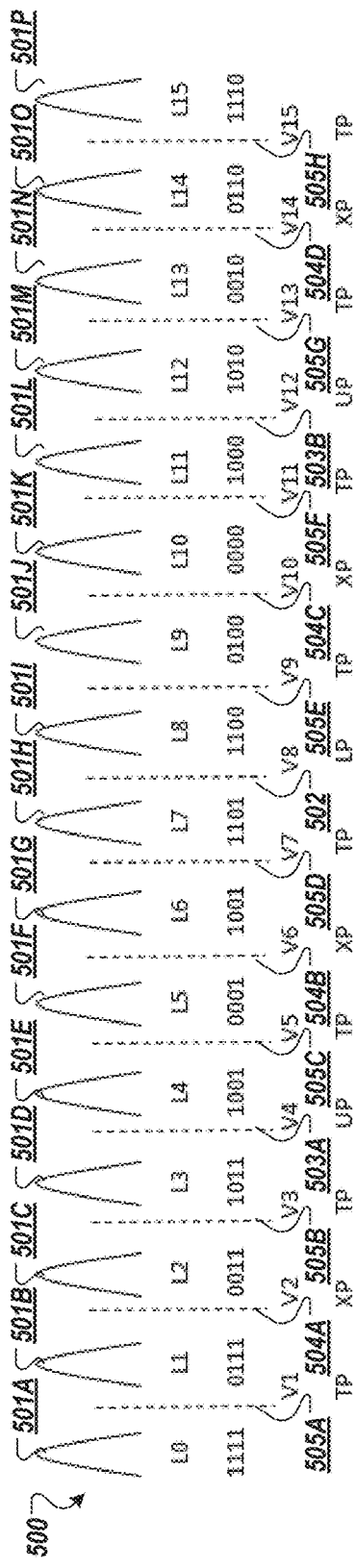
FIG. 5B illustrates a set of rules that correspond to an adjusting of a program verify target of a last programming distribution and a locking of a program verify target of a programming distribution adjacent to an initial programming distribution, in accordance with embodiments of the disclosure.

FIG. 5B illustrates a set of rules that correspond to an adjusting of a PV target of a last programming distribution and a locking of a PV target of a programming distribution adjacent to an initial programming distribution, in accordance with embodiments of the disclosure. Diagram 500 of FIG. 5A is provided to help illustrate FIG. 5B. Set of rules 520 can be similarly implemented to set of rules 510, unless otherwise described. Set of rules 520 shows a set of rules where the PV target of the second distribution is locked and the PV target of the last distribution is allowed to be adjusted. In embodiments, set of rules 520 can be implemented as an alternative to other sets of rules for cases 13-28, as described herein. A couple of rules (i.e., cases) of set of rules 520 are described below to help illustrate implementations using set of rules 520.

In case 20 of set of rules 520, the BER of the LP is less than the BER of the TP. The Most Needy valley of the TP is valley 15 (V15), and the Least Needy valley of the LP is valley 1 (V1). One voltage trim level (e.g., −10 mv) is taken to the PV targets of program distributions L8:L15 (e.g., labeled as −1). The program distributions L8:L15 are moved in an accordion-like manner, such that all the PV targets of the program distributions (L8:L15) are moved in the same direction and same magnitude. It can be noted that in case 20, RWB is given to no valley, but the program distribution (L15) is given additional margin away from the top voltage level limit. Moving program distribution L15 to the left (−10 mV) gives additional margin between program distribution L15 and the top voltage level limit. Valleys V9:V15 experience no change in relative width (or RWB) since all the PV targets for program distributions L8:L15 shift to left by the same magnitude and direction (e.g., to the left by −10 mV). The corresponding valleys V9:V15 shift to the left a corresponding amount, but do not change in relative width. RWB is taken from valley 8 (V8) of the LP as the PV target of program distribution L8 is moved to the left and the PV target of program distribution L7 remains stationary. Valley 8 (V8) of the LP is squeezed to give margin between the last program distribution of the TP and the top voltage level limit in a net-zero adjustment.

It can be noted that case 28 of set of rules 520, is the opposite of case 20. In case 28, the BER of the LP is greater than the BER of the TP. The Most Needy valley of the LP is valley 8 (V8), and the Least Needy valley of the TP is valley 15 (V15). In case 28, one voltage trim level (e.g., +10 mv) is given to the PV targets of program distributions L8:L15 (e.g., labeled as +1). The program distributions L8:L15 are moved in an accordion-like manner, such that all the PV targets of program distributions L8:L15 are moved in the same direction and same magnitude. It can be noted that in case 28, RWB is taken from margin between program distribution L15 and the top voltage level limit as PV target of the programming distribution L15 is moved to the right. Valleys V9:V15 experience no change in relative width (or RWB) since all the PV targets for program distributions L8:L15 shift in the same direction and by the same magnitude (e.g., right by +10 mV). RWB is given to valley 8 (V8) of the LP as the PV target of program distribution L8 is moved to the right (e.g., +10 mV) and the PV target of program distribution L7 remains stationary. The margin between program distribution L15 of the TP and the top voltage level limit is squeezed to give margin to valley 8 (V8) of the LP in a net-zero adjustment.

It can be further noted that set of rules 520 are rules where program distribution L1 is locked such that the PV target of program distribution L1 is not adjusted by the program targeting operation. The "0"s that are placed in the column designated by "L1" are used to illustrate that PV targets of program distribution L1 are not allowed to be adjusted during a program targeting operation.

Figure 5C:
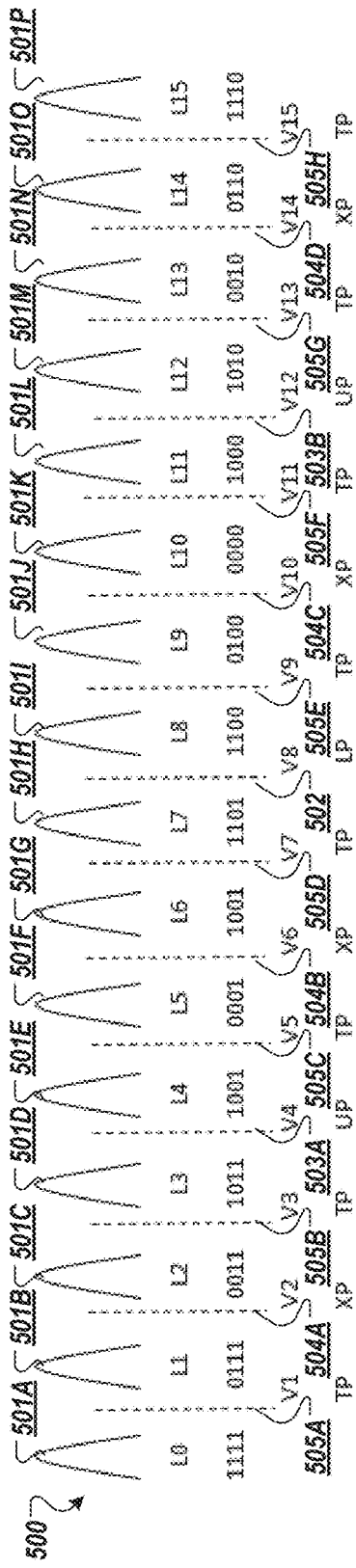
FIG. 5C illustrates a set of rules that correspond to an adjusting of a program verify target of a last programming distribution and a program verify target of a programming distribution adjacent to an initial programming distribution, in accordance with embodiments of the disclosure.
Figure 5D:
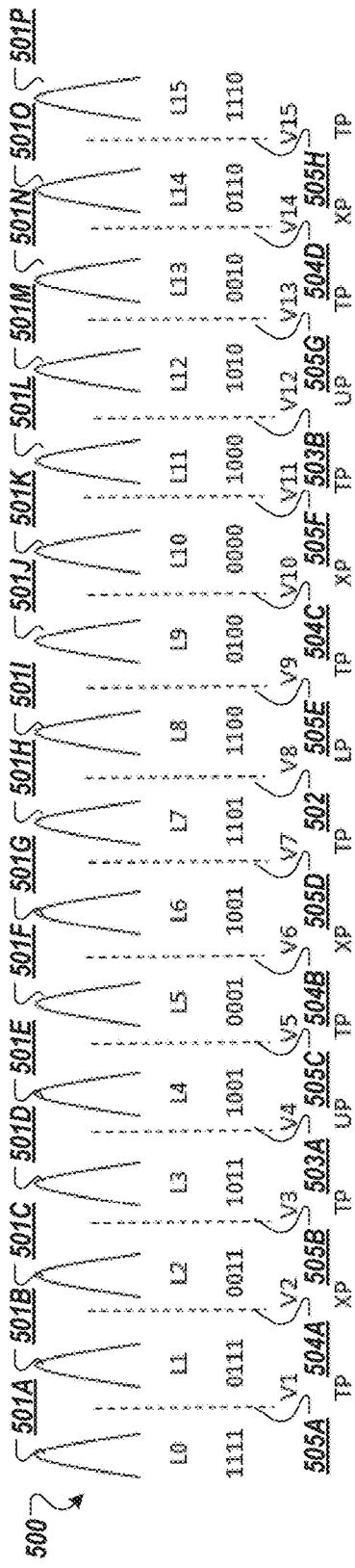
FIG. 5D illustrates a set of rules that correspond to an adjusting of program verify targets for different logical page types, in accordance with embodiments of the disclosure.

FIG. 5C illustrates a set of rules that correspond to an adjusting of a PV target of a last programming distribution and a PV target of a programming distribution adjacent to an initial programming distribution, in accordance with embodiments of the disclosure. Diagram 500 of FIG. 5A is provided to help illustrate FIG. 5C. Set of rules 530 can be similarly implemented to set of rules 510 or set of rules 520, unless otherwise described. Set of rules 530 shows a set of rules where the PV target of the second distribution and the PV target of the last distribution are allowed to be adjusted. A couple of rules (i.e., cases) of set of rules 530 are described below to help illustrate implementations using set of rules 530. It can be noted that case 13 of set of rules 530 is the same as case 13 of set of rules 510, and case 20 of set of rules 530 is the same as case 20 of set of rules 520. Similarly, case 21 of set of rules 530 is the same as case 21 of set of rules 510, and case 28 of set of rules 530 is the same as case 28 of set of rules 520. In embodiments, set of rules 530 can be implemented as an alternative to other sets of rules for cases 13-28, as described herein.

FIG. 5D illustrates a set of rules that corresponds to an adjusting of PV targets for different logical page types, in accordance with embodiments of the disclosure. Diagram 500 of FIG. 5A is provided to help illustrate FIG. 5D. As noted above, the PV targets of logical page types can be adjusted with respect to the LP using a set of rules. Set of rules 540 shows rules (e.g., cases 1-4) for the program targeting operation to perform PV target adjustments for UP with respect to LP (e.g., LP-UP updated) in a QLC memory. Set of rules 540 also shows rules (e.g., cases 5-12) for the program targeting operation to perform PV target adjustments for XP with respect to LP (e.g., LP-XP update) in QLC memory. Set of rules 540 can be used in conjunction with set of rules 510, 520, or 530. As noted above, set of rules 510, 520, and 530 illustrated cases 13-28. Set of rules 540 illustrate cases 1-12. In some implementations, one of the set or rules 510, 520, or 530 can be used in conjunction with set of rules 540 to perform program targeting operation. In some embodiments, to perform program targeting operation the program targeting component 113 alternates between adjusting the PV targets of one of the UP, XP, or TP with respect to the LP (for QLC memory). For example, the program targeting operation can change the PV targets for the UP with respect to the LP (e.g., LP-UP update, cases 1-4). At some later time, the program targeting operation can change the PV targets for XP with respect to the LP (e.g., LP-XP Update, cases 5-12). As some still later time the program targeting operation can change the PV targets for the TP with respect to the LP (e.g., LP-TP Update, cases 13-28). It can be noted that since the number of cases vary depending on the logical page types involved, in some embodiments, the LP-TP update can be performed more frequently than the LP-XP Update, which can be performed more frequently than the LP-UP update.

Figure 6:
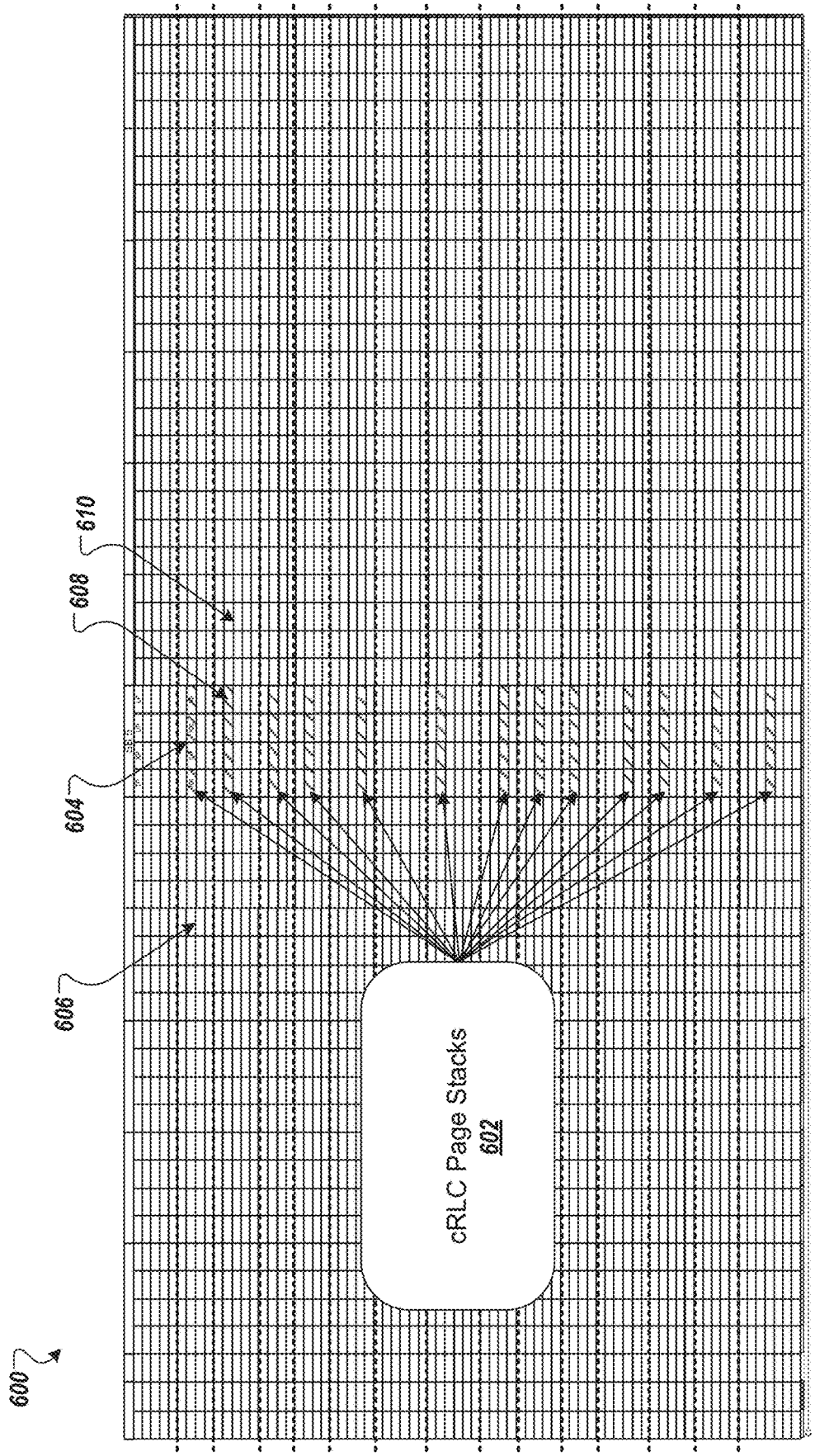
FIG. 6 is a page map of a memory block for a full block program operation with multiple continuous read level calibration (cRLC) page stacks, in accordance with some embodiments of the disclosure.

FIG. 6 is a page map 600 of a memory block for a full block program operation with multiple cRLC page stacks, in accordance with some embodiments of the disclosure. The page map 600 is a programming operation page map for a memory component having 38 wordlines (WL) per block and 9 wordline groups (WLGs) per block. The page map 600 can include sixteen sub-blocks in each block, where each sub-block of each WLG contains just one page type (e.g., LP, UP, XP, TP). The memory block can include SLC pages in the first and last WLGs, MLC pages in the second and second-to-last WLGs, and TLC pages in the intervening WLGs. Each read trim can be an N-bit offset register within the block. For example, an 8-bit offset register could be used where 7 bits are the magnitude and 1 bit is the sign convention. For each trim type, there can be a base trim value so that the offset trims for each page type are a +/− offset value relative to the base value. The offset value can correspond to the resolution of the trim.

During programming of the memory block selected for a cRLC operation, a block programming sequence is interrupted to perform cRLC. The programming interruption occurs at each page stack selected as one of the cRLC page stacks 602. The program interruption occurs just before a subsequent programming pass when the programming distributions from a previous programming operation have fully aggressed floating gate coupling from their neighbors. During block programming, each of the cRLC page stacks 602 in each of the wordline groups is interrupted and a cRLC is performed until all valleys of the page stack are centered with minimum error rate. For example, during block programming the selected block, a first sample cRLC page stack 604 in a first wordline group 606 is interrupted and a cRLC operation is performed until all valleys (read level thresholds) of the first sample cRLC page stack 604 are centered with minimum error rate. Similarly, during block programming the selected block, a second cRLC page stack 608 in a second wordline group 610 is interrupted and a cRLC operation is performed until all valleys (read level thresholds) of the second sample cRLC page stack 608 are centered with minimum error rate. In one embodiment, the full cRLC operation is run until all trims within the first sample cRLC page stack 608 are confirmed to be at their minimum BER settings. Similarly, for the second sample cRLC page stack 608, the full cRLC operation is run until all trims are confirmed to be at their minimum BER settings. In another embodiment, the cRLC sampling and convergence to minimum BER settings is spread out over many programming operations. For example only one trim within the first sample cRLC page stack 604 gets one cRLC sample on a given block programming. The next block to be programmed would get the next cRLC sample for that trim and so on until enough blocks are programmed that all trims are converged to their minimum BER settings.

It should be noted that when used with the PT operation, the cRLC information from each valley is passed to the PT operation for determining PV target modifications. The cRLC information can include CenterEC, Diff-EC, other metrics, or the like.

Figure 7:
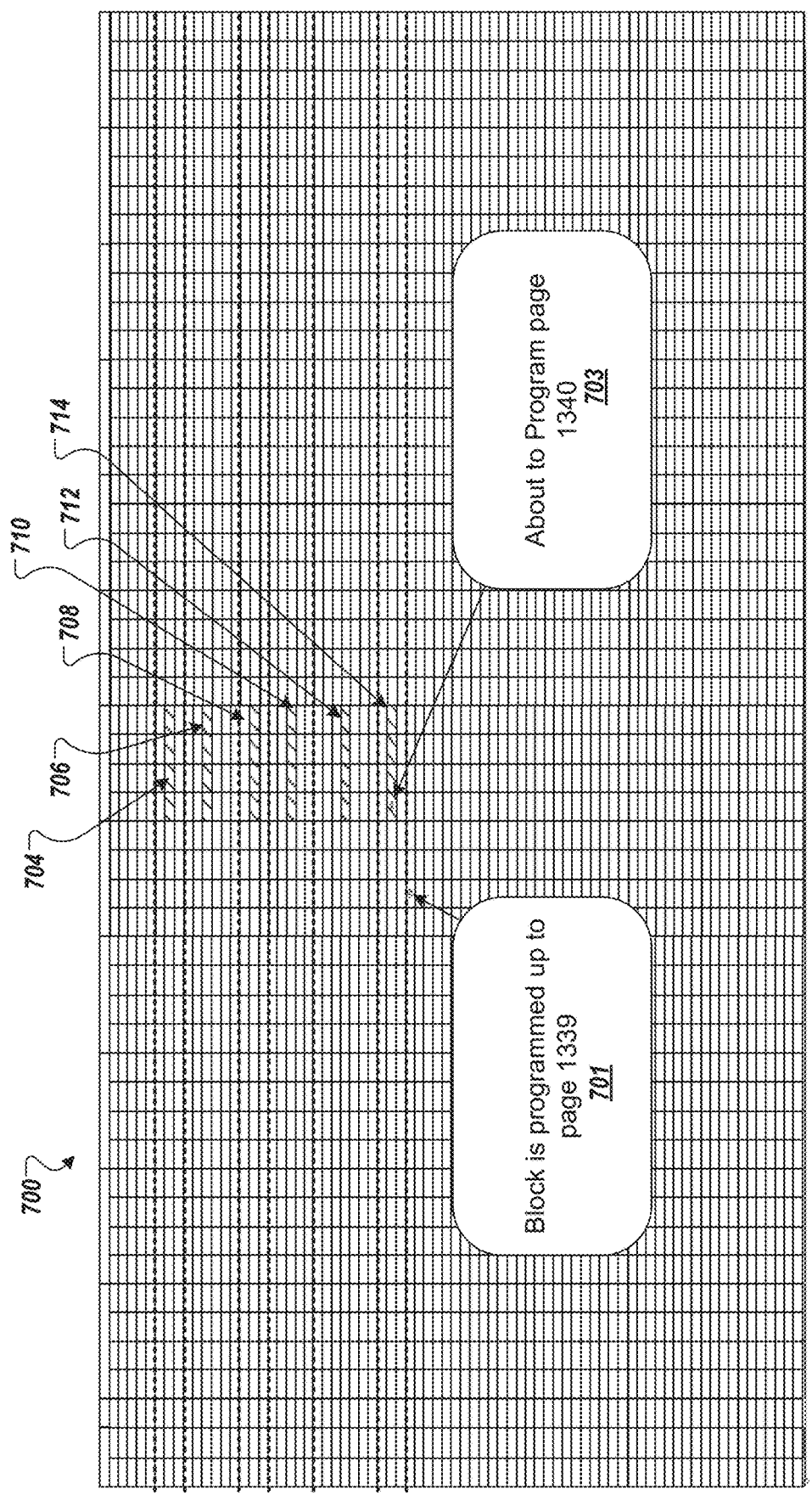
FIG. 7 is a page map of a memory block for a partial block program operation, in accordance with some embodiments of the disclosure.

FIG. 7 is a page map 700 of a memory block for a partial block program operation, in accordance with some embodiments of the disclosure. During programming of the memory block selected for a cRLC operation, a block programming sequence of the block is programmed up to a specified page 701, such as logical page 1339 as illustrated in FIG. 7. The block programming sequence is interrupted just before programming a next logical page 703 of the corresponding logical page, such as the Top Logical Page 1340 as illustrated in FIG. 7. At this point, and at each of the other cRLC page stacks 704-714, the cRLC operation is allowed to fully converge the read level thresholds to become "centered" before the programming sequence is resumed. As described herein, the cRLC information can be passed on to PT to perform its rule based modification of the associated PV trims for the next programming operation.

Figure 8:
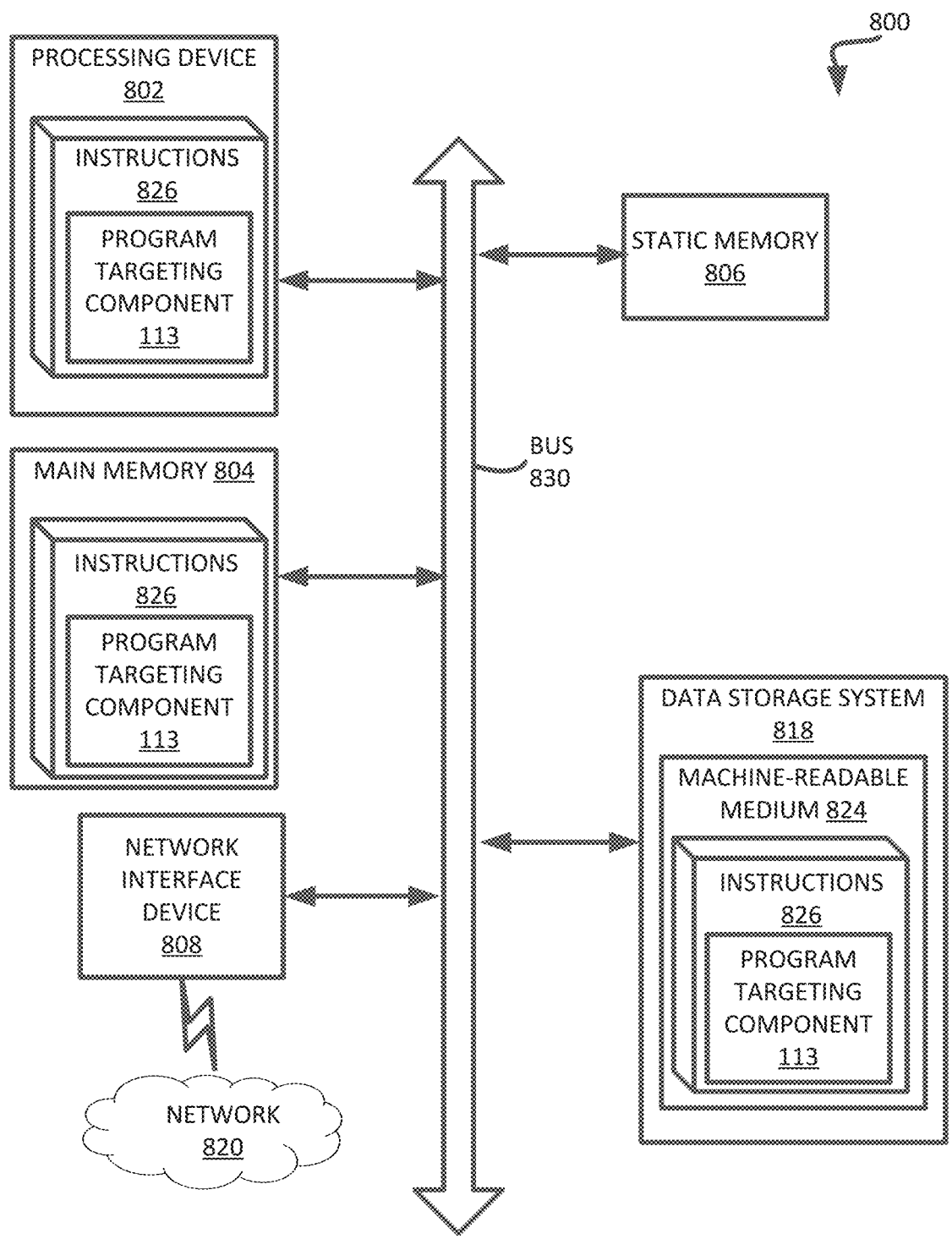
FIG. 8 illustrates an example machine of a computer system within which a set of instructions, for causing the machine to perform any one or more of the operations discussed herein, can be executed.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the program targeting component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a non-transitory computer-readable storage medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to the program targeting component 113 of FIG. 1. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled with the memory device, to:
   determine a plurality of difference error counts (Diff-EC) that are indicative of relative widths of valleys, wherein each of the valleys is located between a respective pair of program distributions of a memory cell of the memory device; and
   perform a program targeting operation on the memory cell to calibrate one or more program verify (PV) targets associated with the programming distributions, wherein to perform the program targeting operation, the processing device is to:
   select a rule from a set of rules based on the plurality of difference error counts, wherein the set of rules corresponds to an adjusting of a PV target of a programming distribution adjacent to an initial programming distribution; and
   adjust, based on the selected rule, the one or more program verify (PV) targets of a plurality of PV targets associated with the programming distributions, wherein the one or more PV targets correspond to one or more respective voltage values for programming memory cells of the memory device.

2. The system of claim 1, wherein the initial programming distribution corresponds to one of the programming distributions of the memory cell having a lowest PV target.

3. The system of claim 1, wherein the set of rules further corresponds to an adjusting of a PV target of a programming distribution corresponding to a highest PV target.

4. The system of claim 1, wherein the set of rules further corresponds to a locking of a PV target of a programming distribution corresponding to a highest PV target.

5. The system of claim 1, wherein the program targeting operation implements the set of rules to balance logical page types such that a bit error rate (BER) is approximately a same BER for different logical page types, and to equalize relative widths of valleys of a particular logical page type such that read window budgets (RWB) for the valleys of the particular logical page type are approximately a same RWB.

6. The system of claim 1, wherein to select the rule from the set of rules based on the plurality of difference error counts, the processing device is further to:
   identify a first logical page type and a second logical page type; and
   determine whether a bit error rate (BER) for the first logical page type is less than or greater than a BER for the second logical page type; and
   responsive to determining that the BER for the first logical page type is less than the BER for the second logical page type, identify a first subset of the set of rules, wherein the selected rule is from the first subset of rules.

7. The system of claim 6, wherein to select the rule from the set of rules based on the plurality of difference error counts, the processing device is further to:
   responsive to determining that the BER for the first logical page type is greater than the BER for the second logical page type, identify a second subset of the set of rules, wherein the selected rule is from the second subset of rules.

8. The system of claim 6, wherein to determine whether the BER for the first logical page type is less than or greater than the BER for the second logical page type, the processing device is further to:
   compare a first average center bit error count associated with the first logical page type to a second average center bit error count associated with the second logical page type, wherein the BER for the first logical page type is less than the BER for the second logical page type when the first average center bit error count is less than the second average center bit error count, and wherein the BER for the first logical page type is greater than the BER for the second logical page type when the first average center bit error count is greater than the second average center bit error count.

9. The system of claim 6, the processing device is further to:
   identify a rule from the first subset of rules based on a valley that has a largest relative width for the first logical page type and a valley that has a least relative width for the second logical page type.

10. The system of claim 9, wherein the plurality of difference error counts are used to determine the valley that has the largest relative width for the first logical page type and the valley that has the least relative width for the second logical page type.

11. The system of claim 1, wherein to select the rule from the set of rules based on the plurality of difference error counts, the processing device is further to:
    select the rule from the set of rules that identifies at least two of the plurality of program verify (PV) targets describing an adjusting such that a relative width of a valley that has a lowest Diff-EC for a first logical page type is decreased and a relative width of a valley that has a highest Diff-EC for a second logical page type is increased.

12. The system of claim 1, wherein to adjust, based on the selected rule, the one or more program verify (PV) targets of the plurality of PV targets associated with the programming distributions the processing device is further to adjust at least the PV target of the programming distribution adjacent to the initial programming distribution.

13. The system of claim 1, wherein the processing device is further to perform the program targeting operation responsive to a satisfaction of one or more conditions.

14. A method comprising:
    determining, by a processing device, a plurality of difference error counts (Diff-EC) that are indicative of relative widths of valleys, wherein each of the valleys is located between a respective pair of programming distributions of a memory cell of a memory device; and performing a program targeting operation on the memory cell to calibrate one or more program verify (PV) targets associated with the programming distributions, wherein performing the program targeting operation comprises:

selecting a rule from a set of rules based on the plurality of difference error counts, wherein the set of rules corresponds to an adjusting of a PV target of a programming distribution adjacent to an initial programming distribution; and adjusting, based on the selected rule, the one or more program verify (PV) targets of a plurality of PV targets associated with the programming distributions, wherein the one or more PV targets correspond to one or more respective voltage values for programming memory cells of the memory device.

15. The method of claim 14, wherein the initial programming distribution corresponds to one of the programming distributions of the memory cell having a lowest PV target.

16. The method of claim 14, wherein the set of rules further corresponds to an adjusting of a PV target of a programming distribution corresponding to a highest PV target.

17. A non-transitory computer-readable medium comprising instruction that, responsive to execution by a processing device, cause the processing device to perform operations comprising:

determining, by the processing device, a plurality of difference error counts (Diff-EC) that are indicative of relative widths of valleys, wherein each of the valleys is located between a respective pair of programming distributions of a memory cell of a memory device; and performing a program targeting operation on the memory cell to calibrate one or more program verify (PV) targets associated with the programming distributions, wherein performing the program targeting operation comprises:

selecting a rule from a set of rules based on the plurality of difference error counts, wherein the set of rules corresponds to an adjusting of a PV target of a programming distribution adjacent to an initial programming distribution; and adjusting, based on the selected rule, the one or more program verify (PV) targets of a plurality of PV targets associated with the programming distributions, wherein the one or more PV targets correspond to one or more respective voltage values for programming memory cells of the memory device.

18. The non-transitory computer-readable medium of claim 17, wherein the initial programming distribution corresponds to one of the programming distributions of the memory cell having a lowest PV target.

19. The non-transitory computer-readable medium of claim 17, wherein the set of rules further corresponds to an adjusting of a PV target of a programming distribution corresponding to a highest PV target.

20. The non-transitory computer-readable medium of claim 17, wherein the program targeting operation implements the set of rules to balance logical page types such that a bit error rate (BER) is approximately a same BER for different logical page types, and to equalize relative widths of valleys of a particular logical page type such that read window budgets (RWB) for the valleys of the particular logical page type are approximately a same RWB.

\* \* \* \* \*